(12) United States Patent
Hoshino et al.

(10) Patent No.: US 12,022,611 B2
(45) Date of Patent: Jun. 25, 2024

(54) PREPREG, METAL-CLAD LAMINATE, AND WIRING BOARD

(71) Applicant: PANASONIC INTELLECTUAL PROPERTY MANAGEMENT CO., LTD., Osaka (JP)

(72) Inventors: Yasunori Hoshino, Osaka (JP); Yuki Kitai, Osaka (JP); Atsushi Wada, Osaka (JP); Masashi Koda, Fukushima (JP); Mikio Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 218 days.

(21) Appl. No.: 17/440,528

(22) PCT Filed: Mar. 26, 2020

(86) PCT No.: PCT/JP2020/013679
§ 371 (c)(1),
(2) Date: Sep. 17, 2021

(87) PCT Pub. No.: WO2020/196759
PCT Pub. Date: Oct. 1, 2020

(65) Prior Publication Data
US 2022/0159830 A1  May 19, 2022

(30) Foreign Application Priority Data

Mar. 27, 2019 (JP) .................... 2019-061262

(51) Int. Cl.
*H05K 1/03* (2006.01)
*C08J 5/24* (2006.01)
*H05K 1/05* (2006.01)

(52) U.S. Cl.
CPC .............. *H05K 1/036* (2013.01); *C08J 5/244* (2021.05); *C08J 5/248* (2021.05); *C08J 5/249* (2021.05);
(Continued)

(58) Field of Classification Search
CPC ..... H05K 2201/029; H05K 2201/0209; H05K 1/056; H05K 1/0373; H05K 1/0366;
(Continued)

(56) References Cited

U.S. PATENT DOCUMENTS

2004/0146692 A1* 7/2004 Inoue ................... C08G 65/485
428/141
2004/0225082 A1* 11/2004 Maeda ................. C08G 65/485
525/534
(Continued)

FOREIGN PATENT DOCUMENTS

CN    108411446 A    8/2018
CN    109385021 A  †  2/2019
(Continued)

OTHER PUBLICATIONS

ISR issued in WIPO Patent Application No. PCT/JP2020/013679, Jun. 16, 2020, English translation.
(Continued)

*Primary Examiner* — William H. Mayo, III
*Assistant Examiner* — Rhadames Alonzo Miller
(74) *Attorney, Agent, or Firm* — GREENBLUM & BERNSTEIN, P.L.C.

(57) ABSTRACT

A prepreg includes: a resin composition or a semi-cured product thereof; and a fibrous base material, wherein the resin composition contains a polymer having a structural unit expressed by the formula (1) in a molecule, and a curing agent each at a predetermined content rate. A cured product
(Continued)

of the resin composition has a Dk of 2.6 to 3.8, and the fibrous base material includes a glass cloth having a Dk of 4.7 or less and a Df of 0.0033 or less. A cured product of the prepreg has a Dk of 2.7 to 3.8, and a Df of 0.002 or less.

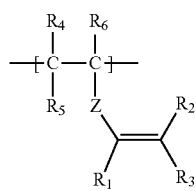

(1)

In the formula (1), Z represents an arylene group, $R_1$ to $R_3$ each independently represents a hydrogen atom or an alkyl group, and $R_4$ to $R_6$ each independently represents a hydrogen atom or an alkyl group having 1 to 6 carbon atoms.

10 Claims, 4 Drawing Sheets

(52) U.S. Cl.
CPC ........... *H05K 1/0373* (2013.01); *H05K 1/056* (2013.01); *C08J 2325/16* (2013.01); *H05K 2201/0209* (2013.01)

(58) Field of Classification Search
CPC ......... H05K 1/036; C08L 71/12; C08L 25/16; C08K 5/01; C08K 3/40; C08J 5/244; C08J 5/248; C08J 2371/12; C08J 2325/16
See application file for complete search history.

(56) References Cited

U.S. PATENT DOCUMENTS

| | | | | |
|---|---|---|---|---|
| 2005/0064159 A1* | 3/2005 | Amou | ................... | H05K 1/032 |
| | | | | 428/209 |
| 2007/0129502 A1* | 6/2007 | Kawabe | ................. | C08L 53/00 |
| | | | | 525/391 |
| 2007/0292668 A1* | 12/2007 | Amou | .................... | H05K 1/032 |
| | | | | 428/209 |
| 2008/0254257 A1* | 10/2008 | Inoue | .................... | C08F 283/08 |
| | | | | 524/80 |
| 2008/0261472 A1* | 10/2008 | Amou | ...................... | C08J 5/247 |
| | | | | 442/117 |
| 2010/0129676 A1* | 5/2010 | Fujimoto | ................ | C08L 15/00 |
| | | | | 524/424 |
| 2013/0040153 A1* | 2/2013 | Fujimoto | ................. | C08J 5/244 |
| | | | | 524/502 |
| 2016/0168378 A1* | 6/2016 | Umehara | ............. | H05K 1/0353 |
| | | | | 524/508 |
| 2018/0305846 A1* | 10/2018 | Tachibana | ............ | D03D 1/0082 |
| 2021/0070980 A1 | 3/2021 | Zeng et al. | | |
| 2021/0214547 A1* | 7/2021 | Honda | ................. | C09D 153/02 |
| 2021/0246251 A1* | 8/2021 | Sato | .................... | C08F 290/062 |

FOREIGN PATENT DOCUMENTS

| | | |
|---|---|---|
| JP | 2005-089691 | 4/2005 |
| JP | 2006-516297 | 6/2006 |
| JP | 2008-266408 | 11/2008 |
| JP | 2019-023263 A | 2/2019 |

OTHER PUBLICATIONS

Editors: Wallenberger, Frederick T., Bingham, Paul A. Title: Fiberglass and Glass Technology Page(s) being submitted: 5 Year of publication: 2010 Publisher: Springer US Hardcover ISBN: 978-1-4419-0735-6.†

\* cited by examiner
† cited by third party

PREPREG, METAL-CLAD LAMINATE, AND WIRING BOARD

TECHNICAL FIELD

The present invention relates to a prepreg, a metal-clad laminate, and a wiring board.

BACKGROUND ART

Various electronic devices have experienced a rapid development in a mounting technique, such as high integration of semiconductor devices to be mounted, high densification of wiring, and multilayer formation, with an increase in the amount of information processing. Besides, wiring boards for use in the various electronic devices are required to adapt to a high-frequency, like a millimeter-wave radar substrate for on-vehicle applications, for example. A substrate material for constituting a base material of such a wiring board for use in the various electronic devises is required to have a low dielectric constant and a low dielectric loss tangent to increase a transmission rate of a signal and to reduce a loss in signal transmission.

On the other hand, the substrate material for constituting the base material of the wiring board is required to have excellent heat resistance as well as the low dielectric constant and the low dielectric loss tangent. It is conceivable from these perspectives to enhance the heat resistance by using a resin polymerizable together with a curing agent, e.g., a resin having a vinyl group, as a resin to be contained in the substrate material.

Examples of such a substrate material include a prepreg and a laminate using a resin composition containing a modified polyphenylene ether which has a terminal end modified by a substituent having a carbon-carbon unsaturated double bond. Patent Literature 1 discloses a prepreg and a laminate using a polyphenylene ether resin composition containing: polyphenylene ether having a polyphenylene ether moiety in a molecular structure, an ethynylbenzyl group and the like at the molecular end, and a number average molecular weight of 1,000 to 7,000; and a crosslinking type curing agent.

Patent Literature 1 discloses that a laminate having high heat resistance and high moldability is obtainable without deteriorating dielectric characteristics. Use of a material having a lowered dielectric constant and a lowered dielectric loss tangent as the substrate material for producing the insulating layer on the wiring board in this manner is considered to achieve a reduction in a loss in signal transmission in the obtained wiring board.

In contrast, a wiring board obtained by using a prepreg containing a glass cloth is known to cause a distortion called a skew which reduces signal quality. In particular, a wiring board provided in an electronic device utilizing a high-frequency band is known to have notably reduced signal quality due to a skew. This notable reduction is believed to be attributed to a difference in the dielectric constant arising between a portion where a yarn constituting the glass cloth is present and a portion where the yarn is absent in the metal-clad laminate and the wiring board obtained by using the prepreg containing the glass cloth.

CITATION LIST

Patent Literature

Patent Literature 1: Japanese Unexamined Patent Publication No. 2006-516297

SUMMARY OF INVENTION

The present invention has been made in view of the aforementioned circumstances, and an object thereof is to provide a prepreg and a metal-clad laminate suitable for manufacturing a wiring board having excellent heat resistance and sufficiently suppressing a loss in signal transmission and a reduction in signal quality due to a skew. Another object of the present invention is to provide a wiring board having excellent heat resistance and sufficiently suppressing a loss in signal transmission and a reduction in signal quality due to a skew.

According to an aspect of the present invention, a prepreg includes a resin composition or a semi-cured product of the resin composition and a fibrous base material, wherein the resin composition contains a polymer having a structural unit expressed by the following formula (1) in a molecule, and a curing agent. The polymer has a content rate of 40 to 90 mass % relative to a total mass of the polymer and the curing agent. A cured product of the resin composition has a relative dielectric constant of 2.6 to 3.8, and the fibrous base material includes a glass cloth having a relative dielectric constant of 4.7 or less and a dielectric loss tangent of 0.0033 or less. A cured product of the prepreg has a relative dielectric constant of 2.7 to 3.8, and a dielectric loss tangent of 0.002 or less.

[Chemical formula1]

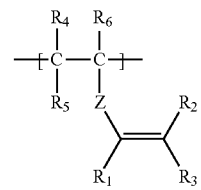

(1)

In the formula (I), Z represents an arylene group, $R_1$ to $R_3$ each independently represents a hydrogen atom or an alkyl group, and $R_4$ to $R_6$ each independently represents a hydrogen atom or an alkyl group having 1 to 6 carbon atoms.

DESCRIPTION OF EMBODIMENTS

A skew is considered to occur due to a difference in a dielectric constant arising between a portion where a glass cloth is present and a portion where the glass cloth is absent in a metal-clad laminate and a wiring board obtained by using a prepreg containing a glass cloth, and the present inventors have focused on the occurrence due to the difference. Further, the present inventors have focused on insufficient conventional studies for a raw material itself of the fibrous base material constituting the prepreg in comparison to the studies for a way of knitting a glass cloth by, for example, opening a yarn in the glass cloth to reduce a variation in the density and for exclusion of the glass cloth to suppress a reduction in signal quality due to a skew attributed to the glass cloth. The present inventors having studied such a raw material of the fibrous base material have discovered the following fact. Specifically, use of a glass cloth having a relatively high dielectric constant as the fibrous base material leads to use of a resin composition whose cured product has a low dielectric constant as the resin composition constituting the prepreg to lower the dielectric constant of the cured product of the prepreg. The present inventors have found from this perspective that a difference in the dielectric constant arises between a portion where the yarn is present and a portion where the yarn is absent, which makes it difficult to suppress a reduction in signal quality due to a skew. Accordingly, the present inventors have focused on the fact that, for example, a quartz glass cloth having a relatively high content rate of $SiO_2$ has a relatively low dielectric constant, and thus have used, as the fibrous base material, a glass cloth having a relatively low dielectric constant such as the quartz glass cloth to examine structures of a resin composition and a prepreg resulting therefrom in detail. As a result, the present inventors have found that the aforementioned object is achievable by the present invention to be described below.

The embodiments of the present invention will be described below, but the present invention is not limited thereto.

Prepreg

Figure 1:
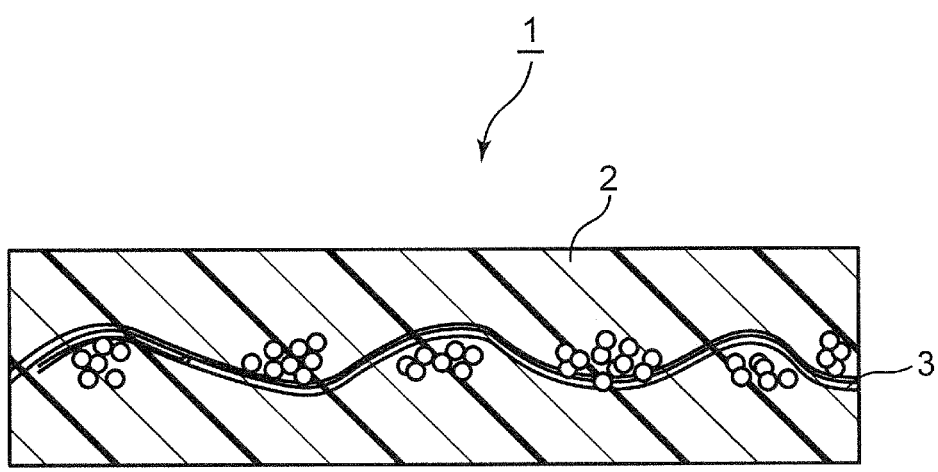
FIG. 1 is a schematic cross-sectional view showing an example of a prepreg according to an embodiment of the present invention.

A prepreg according to an embodiment of the present invention includes a resin composition or a semi-cured product of the resin composition and a fibrous base material. As shown in FIG. 1, for example, the prepreg 1 includes a resin composition or a semi-cured product 2 of the resin composition, and a fibrous base material 3 which is present in the resin composition or the semi-cured product 2 of the resin composition. FIG. 1 is a schematic cross-sectional view showing an example of the prepreg 1 according to the present embodiment.

In the present embodiment, the semi-cured product is in a state in which the resin composition has been cured to such a degree as to be further curable. Specifically, the semi-cured product is in a state in which the resin composition has been semi-cured (B-staged). For example, when a resin composition is heated, first, the viscosity of the resin composition gradually decreases while the resin composition melts, and thereafter, curing begins and the viscosity gradually increases. In this case, the semi-curing state covers a state from the beginning of the gradual decrease in the viscosity until a stage before the completion of the curing.

The prepreg according to the present embodiment may include a semi-cured product of the resin composition as described above, or may include an uncured resin composition itself. Specifically, the prepreg according to the present embodiment may include a semi-cured product of the resin composition (the B-stage resin composition) and a fibrous base material, or include the resin composition to be cured (the A-stage resin composition) and a fibrous base material. The resin composition or the semi-cured product of the resin composition may be obtained by drying, or heating and drying the resin composition.

The resin composition in the prepreg according to the present embodiment contains a polymer having a structural unit expressed by the following formula (1) in a molecule, and a curing agent. The polymer has a content rate of 40 to 90 mass % relative to a total mass of the polymer and the curing agent. A cured product of the resin composition has a relative dielectric constant of 2.6 to 3.8. The fibrous base material in the prepreg includes a glass cloth having a relative dielectric constant of 4.7 or less and a dielectric loss tangent of 0.0033 or less. A cured product of the prepreg has a relative dielectric constant of 2.7 to 3.8, and a dielectric loss tangent of 0.002 or less.

[Chemical formula 2]

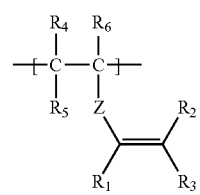

(1)

In the formula (1), Z represents an arylene group, $R_1$ to $R_3$ each independently represents a hydrogen atom or an alkyl group, and $R_4$ to $R_6$ each independently represents a hydrogen atom or an alkyl group having 1 to 6 carbon atoms.

The prepreg described above is suitable for manufacturing a wiring board having excellent heat resistance and sufficiently suppressing a loss in signal transmission and a reduction in signal quality due to a skew. First, the prepreg obtained by using a glass cloth having a relatively low relative dielectric constant as the fibrous base material constituting the prepreg in the above-described manner is expected to have low dielectric characteristics in a cured product thereof. However, the use of the glass cloth having the relatively low relative dielectric constant as the fibrous base material alone in this manner has been found to be insufficient to satisfactorily improve the low dielectric characteristics of the cured product or the heat resistance of the cured product in some cases. Therefore, the prepreg adopts a resin composition containing the polymer and the curing agent in a predetermined ratio as the resin composition constituting the prepreg in addition to the glass cloth having the relatively low relative dielectric constant as the fibrous base material. Further, the composition of the resin composition and the state of the glass cloth are adjusted in the prepreg so that the relative dielectric constant of the cured product of the resin composition, and the relative dielectric constant and the dielectric loss tangent of the cured product of the prepreg fall within the aforementioned ranges. Consequently, it is possible to obtain a prepreg suitable for manufacturing a wiring board having excellent heat resistance and sufficiently suppressing a loss in signal transmission and a reduction in signal quality due to a skew.

Resin Composition

The resin composition used in this embodiment contains the polymer and the curing agent.

Polymer

The polymer is not particularly limited as long as the polymer has a structural unit expressed by the formula (1) in the molecule. The polymer may have a structural unit other than the structural unit expressed by the formula (1) as long as the polymer has the structural unit expressed by the formula (1) in the molecule. The polymer may include a repeating unit in which the structural unit expressed by the formula (1) is repeatedly bonded. Alternatively, the polymer may be a polymer where the repeating unit in which the structural unit expressed by the formula (1) is repeatedly bonded and a repeating unit in which a structural unit other than the structural unit expressed by the formula (1) is repeatedly bonded are randomly bonded. In other words, when the polymer has a structural unit other than the structural unit expressed by the formula (1), the polymer may be a block copolymer or a random copolymer.

The arylene group represented by Z in the formula (1) is not particularly limited. Examples of this arylene group include a monocyclic aromatic group such as a phenylene group and a polycyclic aromatic group in which the aromatic is not monocyclic but polycyclic aromatic such as a naphthalene ring. The arylene group also includes a derivative in which the hydrogen atom bonded to the aromatic ring is substituted with a functional group such as an alkenyl group, an alkynyl group, a formyl group, an alkylcarbonyl group, an alkenyl carbonyl group, or an alkynyl carbonyl group.

In the formula (1), the alkyl group represented by $R_1$ to $R_3$ is not particularly limited, and an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms represented by $R_4$ to $R_6$ in the formula (1) is not particularly limited, and specifically includes, for example, a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit expressed by the formula (1). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, and more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and no group other than this carbon-carbon unsaturated double bond is bonded to the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and no group other than this carbon-carbon unsaturated double bond is bonded to the aromatic ring include styrene, 2-vinylbiphenyl, 3-vinylbiphenyl, 4-vinylbiphenyl, 1-vinylnaphthalene, 2-vinylnaphthalene, and α-alkylated styrene. Examples of the α-alkylated styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nucleus-alkylated aromatic compound and alkoxylated styrene.

Examples of the nucleus-alkylated aromatic compound include an ethyl vinyl aromatic compound in which an alkyl group bonded to an aromatic ring is an ethyl group, nucleus-alkylated styrene in which an alkyl group is bonded to styrene as an aromatic ring, and nucleus-alkylated aromatic compounds (other nucleus-alkylated aromatic compounds) other than the ethyl vinyl aromatic compound and the nucleus-alkylated styrene.

Examples of the ethyl vinyl aromatic compound include o-ethyl vinyl benzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4- ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nucleus-alkylated styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nucleus-alkylated aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxylated styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, m-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more kinds thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more kinds thereof.

Examples of the indenes include indene, alkylated indene, and alkoxyindene. Examples of the alkylated indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkoxyindene include alkoxyindenes such as methoxyindene, ethoxyindene, propoxyindene, butoxyindene, t-butoxyindene, sec-butoxyindene, n-pentoxyindene, 2-methyl-butoxyindene, 3-methyl-butoxyindene, n-hexoxyindene, 2-methyl-pentoxyindene, 3-methyl-pentoxyindene, and 4-methyl-pentoxyindene. As the indenes, the compounds exemplified above may be used singly or in combination of two or more kinds thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as the polymer has the structural unit expressed by the formula (1) in the molecule as described above. The structural unit expressed by the formula (1) preferably includes a structural unit expressed by the following formula (2). In other words, the polymer is preferably a polymer having a structural unit expressed by the following formula (2) in the molecule.

[Chemical formula 3]

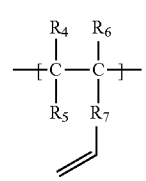

(2)

$R_4$ to $R_6$ in the formula (2) are the same as $R_4$ to $R_6$ in the formula (1). Specifically, $R_4$ to $R_6$ each independently represents a hydrogen atom or an alkyl group having 1 to 6 carbon atoms. $R_7$ represents an arylene group having 6 to 12 carbon atoms.

The arylene group having 6 to 12 carbon atoms in the formula (2) is not particularly limited. Examples of this arylene group include a monocyclic aromatic group such as a phenylene group and a bicyclic aromatic group in which the aromatic is not monocyclic but bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenyl carbonyl group, or an alkynyl carbonyl group.

The structural unit expressed by the formula (2) preferably includes a structural unit expressed by the following formula (3). In other words, in the structural unit expressed by the formula (2), $R_7$ is preferably a phenylene group. The phenylene group may be any one of an o-phenylene group, an m-phenylene group, and a p-phenylene group, and may be two or more kinds thereof. The phenylene group preferably includes a p-phenylene group.

[Chemical formula 4]

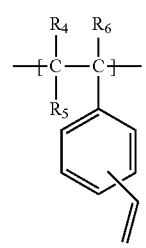

(3)

$R_4$ to $R_6$ in the formula (3) are the same as $R_4$ to $R_6$ in the formula (1). Specifically, $R_4$ to $R_6$ each independently represents a hydrogen atom or an alkyl group having 1 to 6 carbon atoms.

The polymer preferably includes a polymer further having a structural unit expressed by the following formula (4) in the molecule. In other words, it is preferable that the polymer has a structural unit derived from a monofunctional aromatic compound in which one carbon-carbon unsaturated double bond is bonded to an aromatic ring as the structural unit expressed by the following formula (4). Hence, the polymer is preferably a polymer having the structural unit expressed by the formula (1) and the structural unit expressed by the following formula (4) in the molecule. In other words, the polymer may have a structural unit other than the structural unit expressed by the formula (1) and the structural unit expressed by the following formula (4) (structural unit other than (1) and (4)) as long as the polymer has the structural unit expressed by the formula (1) and the structural unit expressed by the following formula (4) in the molecule. The polymer may include a structural unit other than (1) and (4), the polymer may be a polymer in which a repeating unit in which the structural unit expressed by the formula (1) is repeatedly bonded, a repeating unit in which the structural unit expressed by the following formula (4) is repeatedly bonded, and a repeating unit in which a structural unit other than (1) and (4) is repeatedly bonded are randomly bonded, or the polymer may be a block copolymer or a random

[Chemical formula 5]

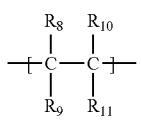

(4)

In the formula (4), $R_8$ to $R_{10}$ are independent of one another. In other words, $R_8$ to $R_{10}$ may be the same group or different groups from one another. $R_8$ to $R_{10}$ represent a hydrogen atom or an alkyl group having 1 to 6 carbon atoms. $R_{11}$ represents an aryl group.

The alkyl group having 1 to 6 carbon atoms represented by $R_8$ to $R_{10}$ in the formula (4) is not particularly limited and may be similar to the alkyl group having 1 to 6 carbon atoms represented by $R_4$ to $R_6$ in the formula (1). Specific examples of the alkyl group having 1 to 6 carbon atoms represented by $R_8$ to $R_{10}$ in the formula (4) include a methyl group, an ethyl group, a propyl group, and a hexyl group.

The aryl group represented by R u in the formula (4) is not particularly limited and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in the formula (4) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. More specific examples of the aryl group in the formula (4), namely, $R_{11}$ include the aryl groups presented in the following Tables 1 and 2.

TABLE 1

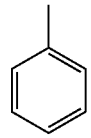

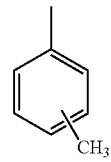

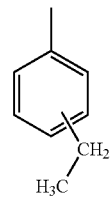

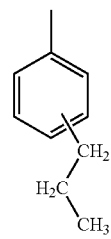

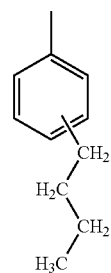

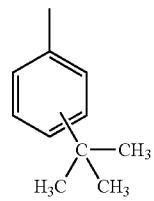

TABLE 2

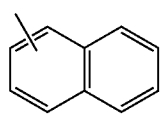

TABLE 2-continued

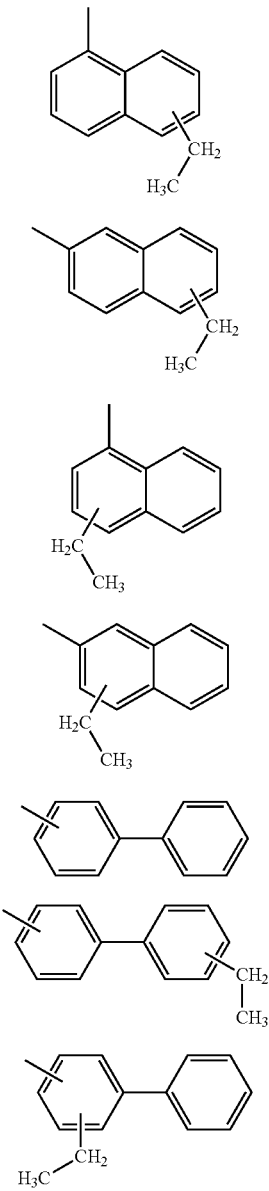

The polymer preferably has a weight average molecular weight of 1,500 to 40,000, and more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content rate of the structural unit expressed by the formula (1) preferably falls within the range of the weight average molecular weight. Specifically, the molar content rate is preferably 2 to 95 mol %, and more preferably 8 to 81 mol %. The molar content rate of the structural unit expressed by the formula (2) and the molar content rate of the structural unit expressed by the formula (3) are the same as the molar content of the structural unit represented by the formula (1). Specifically, the molar content rates are preferably 2 to 95 mol %, and more preferably 8 to 81 mol %. When the polymer has a structural unit expressed by the formula (1) and a structural unit expressed by the formula (4) in the molecule, the molar content rate of the structural unit expressed by the formula (1) is preferably 2 to 95 mol %, and more preferably 8 to 81 mol %, and the molar content rate of the structural unit expressed by the formula (4) is preferably 5 to 98 mol %, and more preferably 19 to 92 mol %.

In the polymer, the average number of structural units expressed by the formula (1) preferably falls within the range of the weight average molecular weight. Specifically, the average number is preferably 1 to 160, and more preferably 3 to 140. The average number of structural units expressed by the formula (2) and the average number of structural units expressed by the formula (3) are the same as the average number of structural units expressed by the formula (1). Specifically, the average numbers are preferably 1 to 160, and more preferably 3 to 140. When the polymer is a polymer having a structural unit expressed by the formula (1) and a structural unit expressed by the formula (4) in the molecule, the average number of structural units expressed by the formula (1) is preferably 1 to 160, and more preferably 3 to 140, and the average number of structural units expressed by the formula (4) is preferably 2 to 350, and more preferably 4 to 300.

Specific examples of the polymer include a polymer having a structural unit expressed by the following formula (6) in the molecule and further at least one of a structural unit expressed by the following formula (5) and a structural unit expressed by the following formula (7). This polymer may be a block copolymer or a random copolymer.

[Chemical formula 6]

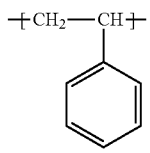

(5)

[Chemical formula 7]

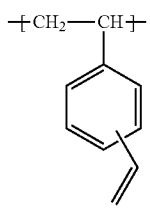

(6)

[Chemical formula 8]

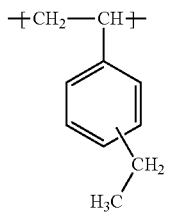

(7)

In the polymer having the structural unit expressed by the formula (6) and further at least one of the structural unit expressed by the formula (5) and the structural unit expressed by the formula (7) in the molecule, the molar content rates of the structural unit expressed by the formula (5), the structural unit expressed by the formula (6), and the structural unit expressed by the formula (7) are preferably 0 to 92 mol %, 8 to 54 mol %, and 0 to 89 mol %, respectively. The average number of structural units expressed by the formula (5) is preferably 0 to 350, the average number of structural units expressed by the formula (6) is preferably 1 to 160, and the average number of structural units expressed by the formula (7) is preferably 0 to 270.

In the polymer, an equivalent of a vinyl group included in the structural unit that is expressed by the formula (1) and has $R_1$ to $R_3$ serving as hydrogen atoms is preferably 250 to 1,200, and more preferably 300 to 1,100. When the equivalent is too small, the number of vinyl groups is too large, the reactivity is too high, and for example, troubles such as deterioration in the storage stability of the resin composition or deterioration in the fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of vinyl groups is too small and the heat resistance of the cured product tends to be insufficient. Hence, when the equivalent is within the above range, excellent heat resistance and moldability are exhibited. The equivalent of the vinyl group included in the structural unit that is expressed by the formula (1) and has $R_1$ to $R_3$ serving as hydrogen atoms is a so-called vinyl equivalent.

A method for producing the polymer is not particularly limited as long as the method is adoptable for producing the polymer. Examples of the method for producing the polymer include a method of causing divinylbenzene, ethyl vinyl benzene, and styrene to react with one another when the polymer has a structural unit expressed by the formulae (5) to (7) in the molecule. A solvent used in this reaction include, for example, n-propyl acetate. A catalyst may be used for the reaction. Examples of the catalyst include a boron trifluoride diethyl ether complex.

Curing Agent

The curing agent is not particularly limited as long as the curing agent can react with the polymer and cure the resin composition containing the polymer. Examples of the curing agent include a curing agent having at least one functional group which contributes to the reaction with the polymer in the molecule. Examples of the curing agent include styrene, styrene derivatives, a compound having an acryloyl group in the molecule, and a compound having a methacryloyl group in the molecule, a compound having a vinyl group in the molecule, a compound having an allyl group in the molecule, a compound having a maleimide group in the molecule, a compound having an acenaphthylene structure in the molecule, and a compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include a diacrylate compound such as tricyclodecanedimethanol diacrylate.

A compound having a methacryloyl group in the molecule is a methacrylate compound. Examples of the methacrylate compound include a monofunctional methacrylate compound having one methacryloyl group in the molecule, and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include a dimethacrylate compound such as tricyclodecane dimethanol dimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include a triallyl isocyanurate compound such as triallyl isocyanurate (TAIC), a diallyl bisphenol compound, and diallyl phthalate (DAP).

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

A compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes.

Examples of the alkylacenaphthylenes include 1-methylacenaphthylene, 3-methylacenaphthylene, 4-methylacenaphthylene, 5-methylacenaphthylene, 1-ethylacenaphthylene, 3-ethylacenaphthylene, 4-ethylacenaphthylene, and 5-ethylacenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule, or a polyfunctional acenaphthylene compound having two or more acenaphthylene structures in the molecule.

A compound having an isocyanurate group in the molecule is an isocyanurate compound. Examples of the isocyanurate compound include a compound (alkenyl isocyanurate compound) further containing an alkenyl group in the molecule. The alkenyl isocyanurate compound may be a compound having an isocyanurate structure and an alkenyl group in the molecule, and examples thereof include a trialkenyl isocyanurate compound such as triallyl isocyanurate (TAIC).

The curing agent is not limited to the compounds exemplified above, but preferable among them are, for example, styrene, the styrene derivative, the acrylate compound, the methacrylate compound, the vinyl compound, the allyl compound, the maleimide compound, the acenaphthylene compound, and the isocyanurate compound. The styrene derivative, the allyl compound, the maleimide compound, and the acenaphthylene compound are more preferable.

As the styrene derivative, dibromostyrene is preferable. As the allyl compound, an allyl isocyanurate compound having two or more allyl groups in the molecule is preferable, and triallyl isocyanurate (TAIC) is more preferable. As the maleimide compound, a monofunctional maleimide compound is preferable. As the acenaphthylene compound, acenaphthylene is preferable.

As the curing agent, the above curing agents may be used singly or in combination of two or more kinds thereof.

The curing agent preferably has a weight average molecular weight of 100 to 5,000, more preferably 100 to 4,000, and still more preferably 100 to 3,000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polymer can be suitably cured by the reaction of the curing agent with the polymer. The weight average molecular weight here may be measured by a general molecular weight measurement method, and specific examples thereof include a value measured by gel permeation chromatography (GPC).

The average number (number of functional groups) of the functional groups which contribute to the reaction of the curing agent with the polymer per one molecule of the curing agent varies depending on the weight average molecular weight of the curing agent but is, for example, preferably 1 to 20, and more preferably 2 to 18. When this number of functional groups is too small, sufficient heat resistance of the cured product tends to be hardly attained. When the number of functional groups is too large, the reactivity is too high and, for example, troubles such as deterioration in the storage stability of the resin composition or deterioration in the fluidity of the resin composition may occur.

Modified Polyphenylene Ether Compound

The resin composition preferably further contains a modified polyphenylene ether compound having a terminal end modified by a substituent having a carbon-carbon unsaturated double bond. The modified polyphenylene ether compound is not particularly limited as long as the compound is a modified polyphenylene ether compound having a terminal end modified by a substituent having a carbon-carbon unsaturated double bond.

The substituent having the carbon-carbon unsaturated double bond is not particularly limited. Examples of the substituent include a substituent expressed by the formula (8) and a substituent expressed by the formula (9).

[Chemical formula 9]

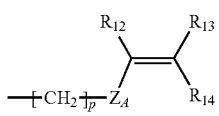

(8)

In the formula (8), p denotes an integer of 0 to 10. $Z_A$ represents an arylene group. $R_{12}$ to $R_{14}$ are independent of one another. In other words, $R_{12}$ to $R_{14}$ may be the same group or different groups from one another. In addition, $R_{12}$ to $R_{14}$ represent a hydrogen atom or an alkyl group.

When p denotes 0 in the formula (8), $Z_A$ is directly bonded to the terminal end of the polyphenylene ether.

The arylene group is not particularly limited. Examples of the arylene group include a monocyclic aromatic group such as a phenylene group or a polycyclic aromatic group in which the aromatic is not monocyclic but polycyclic aromatic such as a naphthalene ring. The arylene group also includes a derivative in which the hydrogen atom bonded to the aromatic ring is substituted with a functional group such as an alkenyl group, an alkynyl group, a formyl group, an alkylcarbonyl group, an alkenyl carbonyl group, or an alkynyl carbonyl group. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

[Chemical formula 10]

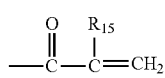

(9)

In the formula (9), $R_{15}$ represents a hydrogen atom or an alkyl group. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

Preferable specific examples of the substituent expressed by the formula (8) include, for example, a substituent containing a vinylbenzyl group. Examples of the substituent containing the vinylbenzyl group include a substituent expressed by the following formula (10). Examples of the substituent represented by formula (9) include an acrylate group and a methacrylate group.

[Chemical formula 11]

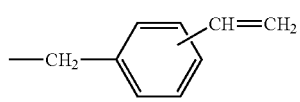

(10)

Specific examples of the substituent include a vinylbenzyl group (ethenylbenzyl group), a vinylphenyl group, an acrylate group, and a methacrylate group. The vinylbenzyl group may be any one of an o-ethenylbenzyl group, an m-ethenylbenzyl group, and a p-ethenylbenzyl group, and may be two or more kinds thereof.

The modified polyphenylene ether compound has a polyphenylene ether chain in the molecule and preferably has, for example, a repeating unit represented by the following formula (11) in the molecule.

[Chemical formula 12]

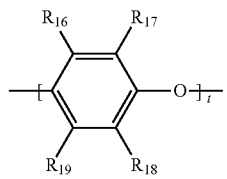

(11)

In the formula (11), t denotes 1 to 50. $R_{16}$ to $R_{19}$ are independent of one another. In other words, $R_{16}$ to $R_{19}$ may be the same group or different groups from one another. $R_{16}$ to $R_{19}$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

Specific examples of the respective functional groups mentioned in $R_{16}$ to $R_{19}$ include the following.

The alkyl group is not particularly limited and is, for example, preferably an alkyl group having 1 to 18 carbon atoms, and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, and more preferably an alkynyl group having 2 to 10 carbon atoms. Specific examples thereof include an ethynyl group and a prop-2-yn-1-yl group (propargyl group).

The alkylcarbonyl group is not particularly limited as long as the alkylcarbonyl group is a carbonyl group substituted with an alkyl group and is, for example, preferably an alkylcarbonyl group having 2 to 18 carbon atoms, and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenyl carbonyl group is not particularly limited as long as the alkenyl carbonyl group is a carbonyl group substituted with an alkenyl group and is, for example, preferably an alkenyl carbonyl group having 3 to 18 carbon atoms, and more preferably an alkenyl carbonyl group having 3 to 10 carbon atoms. Specific examples thereof include an acryloyl group, a methacryloyl group, and a crotonoyl group.

The alkynyl carbonyl group is not particularly limited as long as the alkynyl carbonyl group is a carbonyl group substituted with an alkynyl group and is, for example, preferably an alkynyl carbonyl group having 3 to 18 carbon atoms, and more preferably an alkynyl carbonyl group having 3 to 10 carbon atoms. Specific examples thereof include a propioloyl group.

The weight average molecular weight (Mw) of the modified polyphenylene ether compound is not particularly limited. Specifically, the weight average molecular weight is preferably 500 to 5,000, more preferably 800 to 4,000, and still more preferably 1,000 to 3,000. The weight average molecular weight here may be measured by a general molecular weight measurement method, and specific examples thereof include a value measured by gel permeation chromatography (GPC). In a case where the modified polyphenylene ether compound has a repeating unit expressed by the formula (11) in the molecule, t preferably denotes a numerical value so that the weight average molecular weight of the modified polyphenylene ether compound falls within such a range. Specifically, t preferably denotes 1 to 50.

When the weight average molecular weight of the modified polyphenylene ether compound is within such a range, the modified polyphenylene ether compound exhibits the excellent low dielectric characteristics of polyphenylene ether and not only imparts superior heat resistance to the cured product but also exhibits excellent moldability. This is considered to be attributed to the following. When the weight average molecular weight of ordinary polyphenylene ether is within such a range, the heat resistance of the cured product tends to decrease since the molecular weight is relatively low. With regard to this point, it is considered that a cured product exhibiting sufficiently high heat resistance is obtained since the modified polyphenylene ether compound according to the present embodiment has one more than an unsaturated double bond at the terminal end. When the weight average molecular weight of the modified polyphenylene ether compound is within such a range, the modified polyphenylene ether compound has a relatively low molecular weight and is considered to be excellent in moldability as well. Hence, it is considered that such a modified polyphenylene ether compound is not only excellent in heat resistance of the cured product but also excellent in moldability.

In the modified polyphenylene ether compound, the average number of the substituents (number of terminal functional groups) at the terminal end of the molecule per one molecule of modified polyphenylene ether is not particularly limited. Specifically, the number is preferably 1 to 5, more preferably 1 to 3, and still more preferably 1.5 to 3. When this number of functional groups is too small, sufficient heat resistance of the cured product tends to be hardly attained. When the number of terminal functional groups is too large, the reactivity is too high and, for example, there is a possibility that troubles such as a decrease in storage stability of the resin composition and a decrease in fluidity of the resin composition may occur. In other words, when such modified polyphenylene ether is used, for example, there is a possibility that molding defects such as voids generated at the time of multilayer molding may occur by insufficient fluidity and the like and this may cause a moldability problem so that it is difficult to obtain a highly reliable printed wiring board.

The number of terminal functional groups in the modified polyphenylene ether compound includes a numerical value expressing the average value of the substituents per one molecule of all the modified polyphenylene ether compounds existing in 1 mole of the modified polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the modified polyphenylene ether compound is not particularly limited. Specifically, the intrinsic viscosity may be 0.03 to 0.12 dl/g, but preferably 0.04 to 0.11 dl/g, and more preferably 0.06 to 0.095 dl/g. When the intrinsic viscosity is too low, the molecular weight tends to be low and low dielectric characteristics such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the modified polyphenylene ether compound is within the above range, excellent heat resistance and moldability of the cured product can be realized.

The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the modified polyphenylene ether compound include a modified polyphenylene ether compound expressed by the following formula (12) and a modified polyphenylene ether compound expressed by the following formula (13). As the modified polyphenylene ether compound, these modified polyphenylene ether compounds may be used singly or two kinds of these modified polyphenylene ether compounds may be used in combination.

[Chemical formula 13]

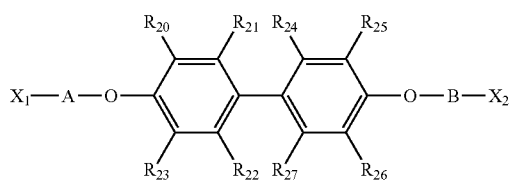

(12)

[Chemical formula 14]

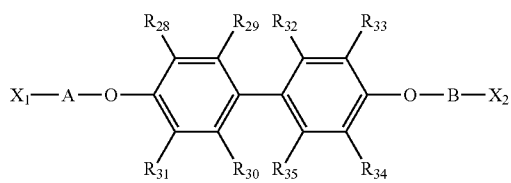

(13)

In the formulae (12) and (13), $R_{20}$ to $R_{27}$ and $R_{28}$ to $R_{35}$ each independently represents a hydrogen atom, an alkyl group, an alkenyl group, an alkynyl group, a formyl group, an alkylcarbonyl group, an alkenyl carbonyl group, or an alkynyl carbonyl group. $X_1$ and $X_2$ each independently represents a substituent having a carbon-carbon unsaturated double bond. A and B each represents repeating units expressed by the following formulae (14) and (15). In the formula (13), Y represents a linear, branched, or cyclic hydrocarbon having 20 or less carbon atoms.

[Chemical formula 15]

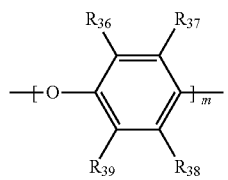

(14)

[Chemical formula 16]

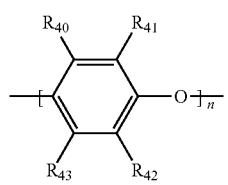

(15)

In the formulae (14) and (15), m and n each denotes 0 to 20. $R_{36}$ to $R_{39}$ and $R_{40}$ to $R_{43}$ each independently represents a hydrogen atom, an alkyl group, an alkenyl group, an alkynyl group, a formyl group, an alkylcarbonyl group, an alkenyl carbonyl group, or an alkynyl carbonyl group.

The modified polyphenylene ether compound expressed by the formula (12) and the modified polyphenylene ether compound expressed by the formula (13) are not particularly limited as long as they are compounds satisfying the above configuration. Specifically, in the formulae (12) and (13), $R_{20}$ to $R_{27}$ and $R_{28}$ to $R_{35}$ are independent of one another as described above. In other words, $R_{20}$ to $R_{27}$ and $R_{28}$ to $R_{35}$ may be the same group or different groups from one another. $R_{20}$ to $R_{27}$ and $R_{28}$ to $R_{35}$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

In the formulae (14) and (15), m and n each preferably denotes 0 to 20 as described above. It is preferable that m and n denote numerical values so that the sum of m and n is 1 to 30. Hence, it is more preferable that m denotes 0 to 20, n denotes 0 to 20, and the sum of m and n is 1 to 30. $R_{36}$ to $R_{39}$ and $R_{40}$ to $R_{43}$ are independent of one another. In other words, $R_{36}$ to $R_{39}$ and $R_{40}$ to $R_{43}$ may be the same group or different groups from one another. $R_{36}$ to $R_{39}$ and $R_{40}$ to $R_{43}$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

$R_{20}$ to $R_{43}$ are the same as $R_{16}$ to $R_{19}$ in the formula (11).

In the formula (12), Y represents a linear, branched, or cyclic hydrocarbon having 20 or less carbon atoms as described above. Examples of Y include a group expressed by the following formula (16).

[Chemical formula 17]

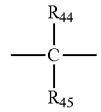

(16)

In the formula (16), $R_{44}$ and $R_{45}$ each independently represents a hydrogen atom or an alkyl group. Examples of the alkyl group include a methyl group. Examples of the group expressed by the formula (16) include a methylene group, a methylmethylene group, and a dimethylmethylene group. Among these, a dimethylmethylene group is preferable.

In the formulae (12) and (13), $X_1$ and $X_2$ are each an independent substituent having a carbon-carbon unsaturated double bond. The substituents $X_1$ and $X_2$ are not particularly limited as long as the substituents $X_1$ and $X_2$ have a carbon-carbon unsaturated double bond. Examples of the substituents $X_1$ and $X_2$ include a substituent expressed by the formula (8). In the modified polyphenylene ether compound expressed by the formula (12) and the modified polyphenylene ether compound expressed by the formula (13), $X_1$ and $X_2$ may be the same substituent or different substituents from each other.

More specific examples of the modified polyphenylene ether compound expressed by the formula (12) include a modified polyphenylene ether compound expressed by the following formula (17).

[Chemical formula 18]

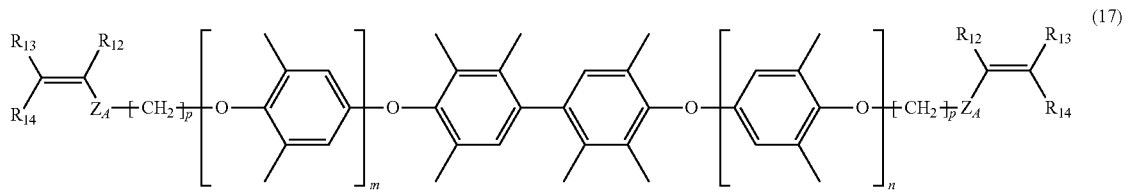

(17)

More specific examples of the modified polyphenylene ether compound expressed by the formula (13) include a modified polyphenylene ether compound expressed by the following formula (18) and a modified polyphenylene ether compound expressed by the following formula (19).

[Chemical formula 19]

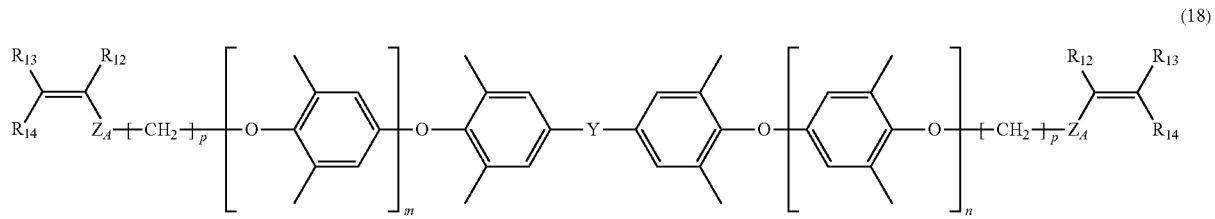

(18)

[Chemical formula 20]

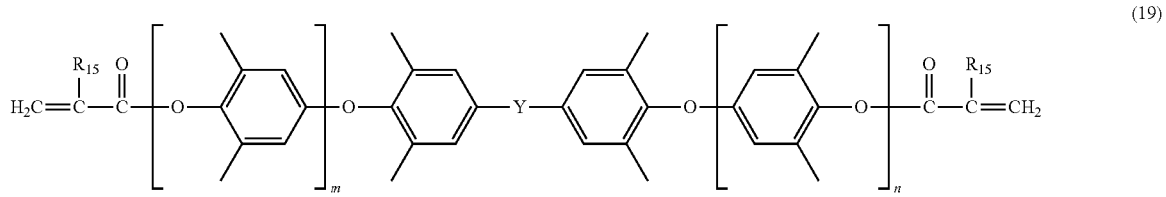

(19)

In the formulae (17) to (19), m and n are the same as m and n in the formulae (14) and (15). In the formulae (17) and (18), $R_{12}$ to $R_{14}$, $Z_A$, and p are the same as $R_{12}$ to $R_{14}$, $Z_A$, and p in the formula (8). In the formulae (18) and (19), Y is the same as Y in the above formula (13). In the formula (19), $R_{15}$ is the same as $R_7$ in the formula (9).

The average number (number of terminal functional groups) of the substituents per molecule of the modified polyphenylene ether compound contained at the molecular end of the modified polyphenylene ether compound falls within the ranges indicated above. Specifically, in the case of the modified polyphenylene ether compounds expressed by the formulae (17) to (19), for example, the average number is preferably 1 to 2, and more preferably 1.5 to 2.

The method for synthesizing the modified polyphenylene ether compound used in the present embodiment is not particularly limited as long as a modified polyphenylene ether compound of which the terminal end is modified with a substituent having a carbon-carbon unsaturated double bond can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents expressed by the formulae (8) to (10) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether composed of 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the modified polyphenylene ether compound used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as the alkali metal hydroxide can act as a dehalogenating agent, and examples thereof include sodium hydroxide. The alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent used at the time of the reaction is not particularly limited as long as the solvent can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be attributed to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a modified polyphenylene ether compound obtained as described above as the modified polyphenylene ether compound.

Content

The content of the polymer is 40 to 90 parts by mass, and preferably 50 to 90 parts by mass relative to 100 parts by mass of a total mass of the polymer and the curing agent. In other words, the polymer occupies 40 to 90 mass % relative to a total mass of the polymer and the curing agent. When the modified polyphenylene ether compound is contained in the resin composition, the content of the polymer is preferably 40 to 90 parts by mass relative to 100 parts by mass of a total of the polymer, the curing agent, and the modified polyphenylene ether compound. In other words, the polymer preferably occupies 40 to 90 mass % relative to a total mass of the polymer, the curing agent, and the modified polyphenylene ether compound. The content of the curing agent is 10 to 60 parts by mass, and preferably 10 to 50 parts by mass relative to 100 parts by mass of a total of the polymer and the curing agent. In other words, the content ratio of the polymer to the curing agent is between 90:10 and 40:60, and preferably between 90:10 and 50:50 by mass ratio. When the content of each of the polymer and the curing agent satisfies the corresponding ratio, the resin composition results in having a cured product more excellent in the heat resistance. This is considered to be because the curing reaction between the polymer and the curing agent suitably proceeds. The resin composition may contain the modified polyphenylene ether compound. In that case, the content of the modified polyphenylene ether compound is preferably 1 to 30 parts by mass, and more preferably 5 to 10 parts by mass relative to 100 parts by mass of a total of the polymer, the curing agent, and the modified polyphenylene ether compound.

Other Component

The resin composition according to the present embodiment may contain a component (another component) other than the polymer and the curing agent without impairing the effect of the present invention, if necessary. Examples of such a component contained in the resin composition according to the present embodiment may further include an additive, such as a silane coupling agent, a flame retardant, an initiator, a defoaming agent, an antioxidant, a thermal stabilizer, an antistatic agent, an ultraviolet absorber, a dye, a pigment, a lubricant, and an inorganic filler. The resin composition may contain a thermosetting resin, such as polyphenylene ether or an epoxy resin other than the polymer and the curing agent.

The resin composition according to the present embodiment may contain a silane coupling agent as described above. The silane coupling agent is not necessarily contained in a resin composition, but may also be contained in an organic filler contained in a resin composition as a silane coupling agent preliminarily used for a surface treatment, or may be contained in a fibrous base material as a silane coupling agent preliminarily used for a surface treatment. The silane coupling agent will be described later.

As described above, the resin composition according to the present embodiment may contain a flame retardant. The flame retardancy of a cured product of the resin composition can be enhanced by containing a flame retardant. The flame retardant is not particularly limited. Specifically, in a field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and a decrease in heat resistance can be suppressed by the use of a halogen-based flame retardant. In the fields required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the flame retardants exemplified may be used singly or in combination of two or more kinds thereof.

As described above, the resin composition according to the present embodiment may contain an initiator (reaction initiator). The curing reaction can proceed even when the resin composition is composed of the polymer and the curing agent. The curing reaction can proceed even when the resin composition is composed only of the polymer. However, a reaction initiator may be added since there is a case where it is difficult to raise the temperature until curing proceeds depending on the process conditions. The reaction initiator is not particularly limited as long as the reaction initiator can promote the curing reaction between the polymer and the curing agent. Specific examples thereof include oxidizing agents such as $\alpha,\alpha'$-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. A metal carboxylate can be concurrently used if necessary. Consequently, the curing reaction can be further promoted. Among these, $\alpha,\alpha'$-bis(t-butylperoxy-m-isopropyl)benzene is preferably used. $\alpha,\alpha'$-bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in the storage stability of the polyphenylene ether resin composition. $\alpha,\alpha'$-bis(t-butylperoxy-m-isopropyl)benzene exhibits low volatility, thus does not volatilize at the time of prepreg drying and storage, and exhibits favorable stability. The reaction initiators may be used singly or in combination of two or more kinds thereof.

The content of the initiator is not particularly limited, and is, for example, preferably 0.1 to 1.8, more preferably 0.1 to 1.5 parts by mass, and still more preferably 0.3 to 1.5 parts by mass relative to 100 parts by mass of a total mass of the polymer, the curing agent, and the modified polyphenylene ether compound. When the initiator content is too small, the curing reaction between the polymer and the curing agent tends to be hardly started in a suitable manner. When the initiator content is too large, the obtained cured product of the prepreg tends to have a larger dielectric loss tangent, and thus can hardly exhibit excellent low dielectric characteristics. Therefore, when the content of the initiator falls within the above range, a cured product of a prepreg having excellent low dielectric characteristics is obtainable.

As described above, the resin composition according to the present embodiment may contain a filler such as an inorganic filler. Examples of the filler include those to be added to enhance the heat resistance and flame retardancy of a cured product of the resin composition, but the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable, and spherical silica is more preferable among these. The filler may be used singly or in combination of two or more kinds thereof. The filler may be used as it is, or a filler subjected to a surface treatment with the silane coupling agent may be used. Examples of the silane coupling agent include a silane coupling agent having a functional group such as a vinyl group, a styryl group, a methacrylic group, and an acrylic group in the molecule.

The content of the inorganic filler is preferably 30 to 280 parts by mass, more preferably 50 to 280 parts by mass, and still more preferably 50 to 250 parts by mass relative to 100 parts by mass of a total mass of the polymer, the curing agent, and the modified polyphenylene ether compound. When the inorganic filler content is too small, the inorganic filler tends to provide a less advantageous effect, for example, fail to satisfactorily enhance the heat resistance and the flame retardancy. When the inorganic filler content is too large, the cured product of the resin composition and the cured product of the prepreg have a higher dielectric constant, and thus tend to hardly exhibit excellent low dielectric characteristics. Conclusively, when the inorganic filler content falls within the above ranges, a cured product of a prepreg excellent in the low dielectric characteristics is obtainable.

The filler is not particularly limited as described above, and an inorganic filler (first inorganic filler) having a molybdenum compound being present on at least a part of the surface thereof is preferably contained. More preferably, the first inorganic filler and a second inorganic filler other than the first inorganic filler are contained in combination.

Such containing of the first inorganic filler can enhance the processability of the substrate obtained by curing the prepreg, for example, suppress a wear in a drill used in a drill processing. The prepreg contains a glass cloth having a relative dielectric constant of 4.7 or less and a dielectric loss tangent of 0.0033 or less as the fibrous base material as described above. A glass cloth having a relatively low relative dielectric constant has a relatively high content ratio of hard $SiO_2$, and thus tends to be fragile. From this perspective, an insulating layer in the metal-clad laminate and the wiring board obtained from a prepreg which contains a glass cloth having a relatively low relative dielectric constant tend to be fragile. Despite such tendency, a metal-clad laminate and a wiring board excellent in a processability such as a drill processability is obtainable by containing the first inorganic filler.

The first inorganic filler is not particularly limited as long as the first inorganic filler has a molybdenum compound being present on at least a part of the surface thereof.

Although the molybdenum compound is known to be used as an inorganic filler, the first inorganic filler herein is not the molybdenum compound itself but an inorganic filler having the molybdenum compound being present on a part of or the whole of a surface of an inorganic substance other than the molybdenum compound. The term "being present on a surface" refers to a state where the molybdenum compound is carried on at least a part of the surface of the inorganic filler (inorganic substance) other than the molybdenum compound, and a state where at least a part of the surface of the inorganic filler (inorganic substance) other than the molybdenum compound is coated with a molybdenum compound.

Examples of the molybdenum compound include a molybdenum compound that can be used as an inorganic filler, more specifically, zinc molybdate, calcium molybdate, and magnesium molybdate. The molybdenum compound may be used singly or in combination of two or more kinds thereof. The use of these molybdenum compounds can further increase the effect obtained by adding the first inorganic filler, for example, the effect of enhancing the processability.

The inorganic filler (such as a carried body of the molybdenum compound in the first inorganic filler) allowing the molybdenum compound to be present (carried) in the first inorganic filler is not particularly limited as long as the inorganic filler is an organic filler other than the molybdenum compound. For example, talc is preferably used in terms of the processability, the heat resistance, and the chemical resistance.

The second inorganic filler is not particularly limited as long as the second organic filler is an organic filler other than the first inorganic filler, and examples thereof include silica such as spherical silica, silicon oxide powder, and crushed silica, barium sulfate, talc such as calcined talc, barium titanate, titanium oxide, clay, alumina, mica, boehmite, zinc borate, zinc stannate, and other metal oxides and metal hydrates. The second inorganic filler may be used singly or in combination of two or more kinds thereof. The use of these second inorganic fillers is expected to achieve suppressed thermal expansion and enhanced dimensional stability of the laminate or the like. Furthermore, the use of silica has an advantage of enhancing the heat resistance and reducing the dielectric loss tangent in the laminate, and is thus preferable.

When the first inorganic filler and the second inorganic filler are contained in combination as the filler, the content of the first inorganic filler is preferably 0.1 to 15 parts by mass, and more preferably 0.1 to 5 parts by mass relative to 100 parts by mass of a total mass of the polymer, the curing agent, and the modified polyphenylene ether compound. The content of the second inorganic filler is preferably 200 parts by mass or less, and more preferably 50 to 200 parts by mass relative to 100 parts by mass of the total content.

Dielectric Characteristics of Resin Composition

The resin composition preferably has a cured product thereof having a relative dielectric constant of 2.6 to 3.8. When the relative dielectric constant of the cured product of the resin composition falls within the above range, a prepreg excellent in the low dielectric characteristics is obtainable. The cured product of the resin composition having a relative dielectric constant within the above range is excellent in the low dielectric characteristics, and can suppress the occurrence of a skew as well. It is preferable to adjust the composition of the resin composition, e.g., the content of each of the inorganic filler and the initiator, so that the relative dielectric constant of the cured product of the resin composition falls within the above range. The resin composition preferably has a cured product having a dielectric loss tangent of 0.004 or less, more preferably 0.003 or less, and still more preferably 0.002 or less. Examples of the relative dielectric constant and the dielectric loss tangent herein include the relative dielectric constant and the dielectric loss tangent of the cured product of the resin composition at 10 GHz, and more specifically, the relative dielectric constant and the dielectric loss tangent of the cured product of the resin composition at 10 GHz measured in accordance with Cavity Resonator Perturbation Method.

Resin Varnish

The resin composition used in the present embodiment may be prepared in the form of a varnish and used. For example, when a prepreg is manufactured, the resin composition may be prepared in the form of a varnish and used for the purpose of impregnating the base material (fibrous base material) for forming the prepreg with the resin composition. In other words, the resin composition may be used as one (resin varnish) prepared in the form of a varnish. In the resin composition used in the present embodiment, the polymer and the curing agent are dissolved in a resin varnish. Such a varnish-like composition (resin varnish) is prepared, for example, as follows.

First, the components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like composition is prepared. The organic solvent used here is not particularly limited as long as the organic solvent dissolves the polymer and the curing agent and does not inhibit the curing reaction. Specific examples thereof include toluene and methyl ethyl ketone (MEK).

Fibrous Base Material

The fibrous base material used in the present embodiment includes a glass cloth having a relative dielectric constant of 4.7 or less and a dielectric loss tangent of 0.0033 or less. The fibrous base material only needs to include the glass cloth, and may also include another fibrous base material. Examples of the glass cloth include a quartz glass (Q glass) cloth, a QL glass cloth, and an L2 glass cloth.

In order to reduce the transmission loss and the skew in the wiring board, the fibrous base material is preferably a glass cloth having a relative dielectric constant of 4.7 or less and a dielectric loss tangent of 0.0033 or less. In order to further reduce the transmission loss and the skew, the fibrous base material is preferably the Q glass cloth having a relative dielectric constant of more than 3.3 and 3.8 or less and a dielectric loss tangent of 0.0017 or less. In order to reduce the transmission loss and the skew and enhance a drill processability, the fibrous base material is preferably a glass cloth having a relative dielectric constant and a dielectric loss tangent within the ranges required for the L2 glass cloth or the QL glass cloth (with a relative dielectric constant of more than 3.8 and 4.7 or less, and a dielectric loss tangent of more than 0.0015 and 0.0033 or less), and more preferably the L2 glass cloth having a relative dielectric constant of more than 4.2 and 4.7 or less and a dielectric loss tangent of more than 0.0015 and 0.0025 or less.

The quartz glass cloth is a glass cloth formed of a quartz glass yarn. The glass constituting the glass cloth is quartz glass (Q glass) having a content rate of 99 mass % or more silicon dioxide (SiO$_2$). The quartz glass cloth is obtainable, for example, by weaving using a quartz glass fiber.

The L2 glass cloth is a glass cloth formed of an L2 glass yarn. The glass constituting the glass cloth is an L2 glass containing 50 to 60 mass % silicon dioxide (SiO$_2$), 10 to 25 mass % B$_2$O$_3$, 15 mass % or less CaO, and 3 mass % or more P$_2$O$_5$. The L2 glass cloth is obtained, for example, by weaving using an L2 glass fiber.

The QL glass cloth is a glass cloth having a hybrid structure composed of the Q glass and the L glass. The L glass is a glass containing 50 to 60 mass % silicon dioxide (SiO$_2$), 10 to 25 mass % B$_2$O$_3$, and 15 mass % or less CaO. The QL glass cloth is a glass cloth obtained by weaving using, for example, a Q glass yarn and an L glass yarn, and is a glass cloth ordinally obtained by weaving using the L glass yarn as a warp and using the Q glass yarn as a weft.

The relative dielectric constant (Dk) and the dielectric loss tangent (Df) of each glass cloth are as follows:

The Q glass cloth has Dk of more than 3.3 and 3.8 or less, and Df of 0.0017 or less.

The L2 glass cloth has Dk of more than 4.2 and 4.7 or less and Df of more than 0.0015 and 0.0025 or less.

The QL glass cloth has Dk of more than 3.8 and 4.3 or less and Df of more than 0.0023 and 0.0033 or less.

The L glass cloth has Dk of more than 4.2 and 4.7 or less and Df of more than 0.0033 and 0.0043 or less.

In the present embodiment, the relative dielectric constant (Dk) and the dielectric loss tangent (Df) of each glass cloth are values determined according to the following measurement method. First, a substrate (copper-clad laminate) is manufactured so as to have a 60 mass % resin content relative to 100 mass % of the prepreg, and a copper foil is removed from the manufactured copper-clad laminate to obtain a sample for evaluating the relative dielectric constant (Dk) and the dielectric loss tangent (Df). Dk and Df of the obtained sample at the frequency of 10 GHz are measured by use of a Network Analyzer (N5230 A manufactured by Keysight Technologies Godo Gaisha) in accordance with Cavity Resonator Perturbation Method. With reference to the values of Dk and Df of the obtained sample (cured product of the prepreg), Dk and Df of the glass cloth is calculated by further using the volume fraction of the glass cloth and Dk and Df of the cured product, which are measured in accordance with Cavity Resonator Perturbation Method, of the resin composition at 10 GHz, the resin composition being used for manufacturing the substrate.

As the fibrous base material to be used in the present embodiment, the fibrous base material may be used as it is, or a fibrous base material subjected to a surface treatment with a silane coupling agent may be also used. Examples of the silane coupling agent include a silane coupling agent having a functional group such as a vinyl group, a styryl group, a methacrylic group, and an acrylic group in the molecule.

As a shape of the fibrous base material, a glass cloth is used. Further, the glass cloth more preferably has an adjusted degree of air permeability after being subjected to an opening process. Examples of the opening process include a process of spraying high-pressure water to the glass cloth and a process of continuously pressurizing the yarn at an appropriate pressure by using a press roll to thereby compress the yarn to be flat. The air permeability of the glass cloth is preferably 200 cm$^3$/cm$^2$/sec or less, more preferably 3 to 100 cm$^3$/cm$^2$/sec, and still more preferably 3 to 50 cm$^3$/cm$^2$/sec. When the degree of air permeability is too large, the opening of the glass cloth tends to be insufficient. When the opening of the glass cloth is insufficient, a pin hole is likely to come into existence while manufacturing the prepreg, a skew is liable to occur due to an increase in the variation in the density of the yarn, and the uniformity in the processing by a drill and the like is liable to be affected. When the degree of air permeability is too small, it is seen that such a strong opening process is performed. This consequently tends to cause a problem such as fluffing in the glass cloth. The air permeability herein is measured by a Frazier type air-permeable tester in conformity with JIS R 3420 (2013). The thickness of the fibrous base material is not particularly limited, and is preferably 0.01 to 0.2 mm, more preferably 0.02 to 0.15 mm, and still more preferably 0.03 to 0.1 mm. The glass cloth may be used as it is, or a glass cloth subjected to a surface treatment with a silane coupling agent may be also used. Examples of the silane coupling agent include a silane coupling agent having a functional group such as a vinyl group, a styryl group, a methacrylic group, and an acrylic group in the molecule.

Silane Coupling Agent

The prepreg may contain a silane coupling agent. The silane coupling agent is not particularly limited, and examples thereof include a silane coupling agent having a carbon-carbon unsaturated double bond in the molecule. The way of adding the silane coupling agent is not limited as long as the silane coupling agent is contained in the prepreg. Examples of the way of adding the silane coupling agent may include, in producing the resin composition, adding the silane coupling agent by adding an inorganic filler preliminarily subjected to a surface treatment with the silane coupling agent, and adding silica and the silane coupling agent in accordance with Integral Blend Method. Alternatively, in manufacturing the prepreg, the silane coupling agent may be added to the prepreg by using a fibrous base material preliminarily subjected to a surface treatment with the silane coupling agent. Among these, the way of adding an inorganic filler preliminarily subjected to a surface treatment with a silane coupling agent and the way of using a fibrous base material preliminarily subjected to a surface treatment with a silane coupling agent are preferable. In other words, as the inorganic filler, an inorganic filler preliminarily subjected to a surface treatment with a silane coupling agent is preferable. As the fibrous base material, a fibrous base material preliminarily subjected to a surface treatment with a silane coupling agent is preferable. As the way of adding the silane coupling agent, the way of using a fibrous base material preliminarily subjected to a surface treatment with a silane coupling agent is more preferable, and a combination of the way of adding an inorganic filler preliminarily subjected to a surface treatment with a silane coupling agent and the way of using a fibrous base material preliminarily subjected to a surface treatment with a silane coupling agent is still more preferable. In brief, an inorganic filler preliminarily subjected to a surface treatment with a silane coupling agent is preferably used as the inorganic filler, and a fibrous base material preliminarily subjected to a surface treatment with a silane coupling agent is preferably used as the fibrous base material.

The silane coupling agent having a carbon-carbon unsaturated double bond in the molecule is not particularly limited as long as the silane coupling agent has a carbon-carbon unsaturated double bond in the molecule. Specific examples of the silane coupling agent include a silane coupling agent having at least one functional group selected from a group consisting of a vinyl group, a styryl group, a methacrylic group, and an acrylic group. In other words, examples of the silane coupling agent include a compound having at least one of the vinyl group, the styryl group, the methacrylic group, and the acrylic group as a reactive functional group, and further having a hydrolyzable group such as a methoxy group or an ethoxy group.

Examples of the silane coupling agent include vinyltriethoxysilane and vinyltrimethoxysilane as the silane coupling agent having the vinyl group.

Examples of the silane coupling agent include p-styryltrimethoxysilane and p-styryltriethoxysilane as the silane coupling agent having the styryl group.

Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as the silane coupling agent having the methacrylic group.

Examples of the silane coupling agent include 3-acryloxypropyltrimethoxysilane and 3-acryloxypropyltriethoxysilane as the silane coupling agent having the acrylic group.

Among the above, the silane coupling agent is preferably a silane coupling agent having at least one of a methacrylic group and an acrylic group in the molecule. In other words, the silane coupling agent is preferably a silane coupling agent having a methacrylic group and a silane coupling agent having an acrylic group. When these silane coupling agents are used, the heat resistance of the obtained prepreg is enhanced, and for example, a sufficiently high heat resistance can be exhibited even under a severe moisture absorption condition.

Dielectric Characteristics of Prepreg

The prepreg has a cured product having a relative dielectric constant of 2.7 to 3.8. The prepreg has the cured product having a dielectric loss tangent of 0.002 or less. A smaller dielectric loss tangent of the cured product of the prepreg is preferable, and 0 is more preferable. From this perspective, the dielectric loss tangent of the cured product of the prepreg is preferably 0 to 0.002. The cured product of the prepreg having a relative dielectric constant and a dielectric loss tangent within the above ranges is excellent in the low dielectric characteristics. It is preferable to adjust the composition of the resin composition, e.g., the content of each of the inorganic filler, the initiator, so that the relative dielectric constant and the dielectric loss tangent of the cured product of the prepreg fall within the above ranges. The relative dielectric constant and the dielectric loss tangent herein include the relative dielectric constant and the dielectric loss tangent of the cured product of the prepreg at 10 GHz.

Resin Content in Prepreg

The resin content in the prepreg is not particularly limited, and is preferably 40 to 90 mass %, more preferably 50 to 90 mass %, and still more preferably 60 to 80 mass %. When the resin content is too low, the low dielectric characteristics is unlikely to be obtained. When the resin content is too high, Coefficient of Thermal Expansion (CTE) tends to be increased or the plate thickness accuracy tends to be reduced. The resin content herein refers to the ratio of a mass obtained by subtracting the mass of the fibrous base material from the mass of the prepreg to a mass of the prepreg [=(mass of prepreg−mass of fibrous base material)/mass of prepreg×100].

Thickness of Prepreg

The thickness of the prepreg is not particularly limited, and, for example, is preferably 0.015 to 0.2 mm, more preferably 0.02 to 0.15 mm, and still more preferably 0.03 to 0.13 mm. When the prepreg is too thin, an increased number of prepregs will be required to obtain a desirable substrate thickness. When the prepreg is too thick, the resin content tends to be lower. Accordingly, desirable low dielectric characteristics are unlikely to be obtained.

Manufacturing Method

Next, a method for manufacturing a prepreg according to the present embodiment will be described.

The method for manufacturing the prepreg is not particularly limited as long as the prepreg can be manufactured. Specifically, when manufacturing a prepreg, the resin composition which has been described above and is used in the present embodiment is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried.

The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 to be cured (A-stage) or in a semi-cured state (B-stage) is obtained. By the heating, the organic solvent can be decreased or removed by being volatilized from the resin varnish.

Metal-Clad Laminate

Figure 2:
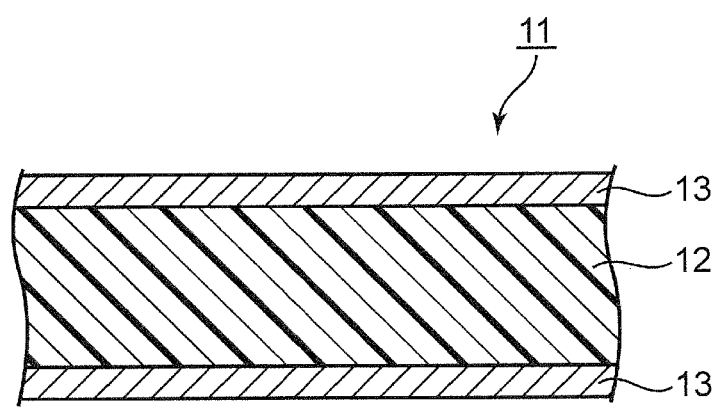
FIG. 2 is a schematic cross-sectional view showing an example of a metal-clad laminate according to an embodiment of the present invention.

As shown in FIG. 2, a metal-clad laminate 11 includes an insulating layer 12 containing a cured product of the prepreg 1 shown in FIG. 1, and a metal foil 13 laminated with the insulating layer 12. In other words, the metal-clad laminate 11 includes the insulating layer 12 containing the cured product of the prepreg 1, and the metal foil 13 joined to the insulating layer 12. The insulating layer 12 may be composed of a cured product of the prepreg 1. FIG. 2 is a schematic cross-sectional view showing an example of the metal-clad laminate 11 according to an embodiment of the present invention.

A method for manufacturing the metal-clad laminate 11 by using the prepreg 1 includes: stacking one or a plurality of prepregs 1; placing a metal foil 13 such as a copper foil over either both upper and lower surfaces or one of the surfaces of the prepreg 1; and heating, pressurizing, and molding the metal foil 13 and the prepreg 1 to be integrally laminated, thereby manufacturing a double-sided metal foil-clad or single-sided metal foil-clad laminate 11. In other words, the metal-clad laminate 11 is obtainable by laminating the metal foil 13 over the prepreg 1 and heating, pressurizing, and molding the laminate. The heating and pressurizing conditions can be appropriately set depending on the thickness of the metal-clad laminate 11 to be manufactured and the type of the composition of the prepreg 1. For example, the temperature can be set to the range of 170 to 210° C., the pressure can be set to the range of 3.5 to 4 MPa, and the time can be set to the range of 60 to 150 minutes. The metal-clad laminate may be manufactured without using a prepreg. For example, there is a way of applying a varnish resin composition on a metal foil to form a layer containing the resin composition on the metal foil, and thereafter performing the heating and pressurizing.

The prepreg according to the present embodiment is suitable for manufacturing a wiring board having excellent heat resistance and sufficiently suppressing a loss in signal transmission and a reduction in signal quality due to a skew. Accordingly, the metal clad laminate obtained by using the present prepreg is suitable for manufacturing a wiring board having excellent heat resistance and sufficiently suppressing a loss in signal transmission and a reduction in signal quality due to a skew in the same manner as the prepreg.

Wiring Board

Figure 3:
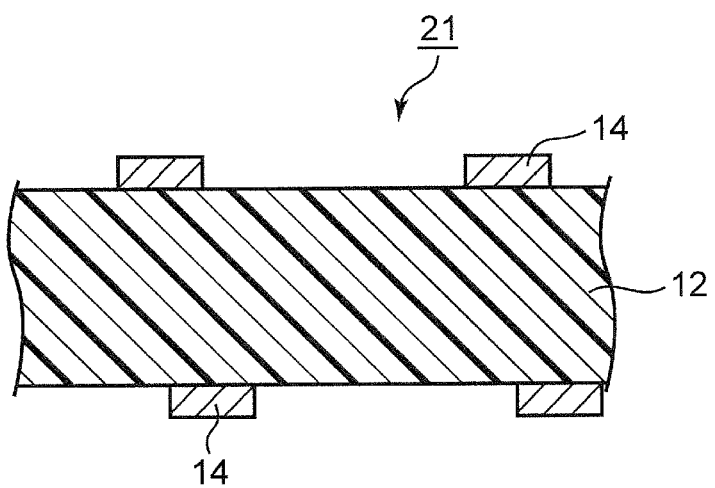
FIG. 3 is a schematic cross-sectional view showing an example of a wiring hoard according to an embodiment of the present invention.

As shown in FIG. 3, a wiring board 21 according to the present embodiment includes an insulating layer 12 containing a cured product of the prepreg 1 shown in FIG. 1, and wiring 14 obtained by partly removing the metal foil 13 and laminated with the insulating layer 12. In other words, the wiring board 21 includes the insulating layer 12 containing the cured product of the prepreg 1 and wiring 14 joined to the insulating layer 12. The insulating layer 12 may be composed of a cured product of the prepreg 1. FIG. 3 is a schematic cross-sectional view showing an example of the wiring board 21 according to an embodiment of the present invention.

A method for manufacturing the wiring board 21 by use of the prepreg 1 include etching the metal foil 13 on the surface of the metal-clad laminate 11 prepared in the above-described manner to form wiring serving as a circuit on a surface of the insulating layer 12. In this way, the wiring board 21 provided with the wiring is obtainable. In other words, the wiring board 21 is obtainable by partly removing the metal foil 13 on the surface of the metal-clad laminate 11 to form the circuit.

The prepreg according to the present embodiment is suitable for manufacturing a wiring board having excellent heat resistance and sufficiently suppressing a loss in signal transmission and a reduction in signal quality due to a skew. Accordingly, the wiring obtained by using the present prepreg has excellent heat resistance and sufficiently suppresses a loss in signal transmission a reduction in signal quality due to a skew.

While the present specification discloses various aspects of the technologies as described above, the main technology thereof will be summarized hereinafter.

A prepreg according to an embodiment of the present invention is a prepreg containing a resin composition or a semi-cured product of the resin composition, and a fibrous base material. In the prepreg, the resin composition contains a polymer having a structural unit expressed by the following formula (1) in a molecule, and a curing agent. The polymer has a content rate of 40 to 90 mass % relative to a total mass of the polymer and the curing agent. A cured product of the resin composition has a relative dielectric constant of 2.6 to 3.8. The fibrous base material includes a glass cloth having a relative dielectric constant of 4.7 or less and a dielectric loss tangent of 0.0033 or less. A cured product of the prepreg has a relative dielectric constant of 2.7 to 3.8, and a dielectric loss tangent of 0.002 or less.

[Chemical formula 21]

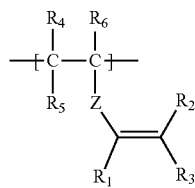

(1)

In the formula (1), Z represents an arylene group. $R_1$ to $R_3$ each independently represents a hydrogen atom or an alkyl group, and $R_4$ to $R_6$ each independently represents a hydrogen atom or an alkyl group having 1 to 6 carbon atoms.

According to the configuration, a prepreg suitable for manufacturing a wiring board having excellent heat resistance and sufficiently suppressing a loss in signal transmission and a reduction in signal quality due to a skew can be provided. First, the prepreg obtained by using a glass cloth such as a quartz glass cloth having a relatively low dielectric constant as the fibrous base material constituting the prepreg is expected to have a cured product thereof excellent in the low dielectric characteristics. However, the use of the glass cloth having the relatively low dielectric constant as the fibrous base material alone has been found to be insufficient to satisfactorily improve the low dielectric characteristics of the cured product or the heat resistance of the cured product in some cases. Therefore, the prepreg adopts a resin composition containing the polymer and the curing agent in a predetermined ratio as the resin composition constituting the prepreg in addition to the glass cloth having a relatively low dielectric constant as the fibrous base material. Further, the composition of the resin composition and the state of the glass cloth are adjusted in the prepreg so that the relative dielectric constant of the cured product of the resin composition and the relative dielectric constant and the dielectric loss tangent of the cured product of the prepreg fall within the aforementioned ranges. Consequently, a prepreg suitable for manufacturing a wiring board having excellent heat resistance and suppressing a loss in signal transmission and a reduction in signal quality due to a skew is obtainable.

In the prepreg, the structural unit expressed by the formula (1) preferably includes a structural unit expressed by the following formula (2).

[Chemical formula 22]

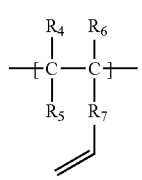

(2)

In the formula (2), $R_4$ to $R_6$ each independently represents a hydrogen atom or an alkyl group having 1 to 6 carbon atoms, and $R_7$ represents an arylene group having 6 to 12 carbon atoms.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the prepreg, the structural unit expressed by the formula (2) preferably includes a structural unit expressed by the following formula (3).

[Chemical Formula 23]

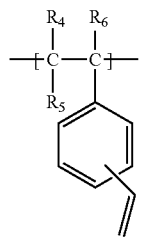

(3)

In the formula (3), $R_4$ to $R_6$ each independently represents a hydrogen atom or an alkyl group having 1 to 6 carbon atoms.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the prepreg, the polymer preferably includes a polymer further having a structural unit expressed b the following formula (4) in the molecule.

[Chemical formula 24]

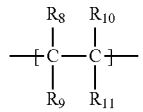

(4)

In the formula (4), $R_8$ to $R_{10}$ each independently represents a hydrogen atom or an alkyl group having 1 to 6 carbon atoms, and $R_{11}$ represents an aryl group.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the prepreg, the aryl group in the structural unit expressed by the formula (4) preferably includes an aryl group having an alkyl group having 1 to 6 carbon atoms.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the prepreg, the polymer preferably has a weight average molecular weight of 1,500 to 40,000.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the polymer in the prepreg, an equivalent of a vinyl group contained in the structural unit expressed by the formula (1) and having $R_1$ to $R_3$ serving as hydrogen atoms is preferably 250 to 1,200.

The configuration makes it possible to provide a prepreg suitable for manufacturing a wiring board having more excellent heat resistance and further suppressing a loss in signal transmission and a reduction in signal quality due to a skew. This is considered to be because the resin composition results in attaining a cured product having lower dielectric characteristics and higher heat resistance.

In the prepreg, the resin composition preferably further contains a modified polyphenylene ether compound having a terminal end modified by a substituent having a carbon-carbon unsaturated double bond.

The configuration makes it possible to provide a prepreg more suitable for manufacturing a wiring board having more excellent heat resistance and sufficiently suppressing a loss in signal transmission and a reduction in signal quality due to a skew.

In the prepreg, the substituent in the modified polyphenylene ether compound preferably includes at least one selected from a group consisting of a vinylbenzyl group, the vinyl group, an acryloyl group, and a methacryloyl group.

The configuration makes it possible to provide a prepreg more suitable for manufacturing a wiring board having more excellent heat resistance and sufficiently suppressing a loss in signal transmission and a reduction in signal quality due to a skew.

In the prepreg, the fibrous base material preferably includes a base material subjected to a surface treatment with a silane coupling agent having a carbon-carbon unsaturated double bond in a molecule.

The configuration makes it possible to provide a prepreg more suitable for manufacturing a wiring board having more excellent heat resistance and sufficiently suppressing a loss in signal transmission and a reduction in signal quality due to a skew.

In the prepreg, the silane coupling agent preferably includes a silane coupling agent having at least one functional group selected from a group consisting of the vinyl group, a styryl group, a methacrylic group, and an acrylic group in the molecule.

The configuration makes it possible to provide a prepreg more suitable for manufacturing a wiring board having more excellent heat resistance and sufficiently suppressing a loss in signal transmission and a reduction in signal quality due to a skew.

In the prepreg, the curing agent preferably contains at least one selected from a group consisting of styrene, a styrene derivative, divinylbenzene, an acrylate compound, a methacrylate compound, a trialkenyl isocyanurate compound, a polybutadiene compound, a maleimide compound, and an acenaphthylene compound.

The configuration makes it possible to provide a prepreg more suitable for manufacturing a wiring board having more excellent heat resistance and sufficiently suppressing a loss in signal transmission and a reduction in signal quality due to a skew.

A metal-clad laminate according to another embodiment of the present invention includes an insulating layer containing the cured product of the prepreg and a metal foil.

The configuration makes it possible to provide a metal-clad laminate more suitable for manufacturing a wiring board having more excellent heat resistance and sufficiently suppressing a loss in signal transmission and a reduction in signal quality due to a skew.

A wiring board according to another embodiment of the present invention includes an insulating layer containing the cured product of the prepreg and wiring.

The configuration makes it possible to provide a wiring board having more excellent heat resistance and sufficiently suppressing a loss in signal transmission and a reduction in signal quality due to a skew.

According to the present invention, a prepreg and a metal-clad laminate suitable for manufacturing a wiring board having more excellent heat resistance and sufficiently suppressing a loss in signal transmission and a reduction in signal quality due to a skew can be provided. Further, according to the present invention, a wiring board having excellent heat resistance and sufficiently suppressing a loss in signal transmission and a reduction in signal quality due to a skew can be provided.

The present invention will be further specifically described by way of Examples hereinafter. However, the scope of the present invention is not limited thereto.

EXAMPLES

Examples 1 to 25, Comparative Examples 1 to 6

Each component used in preparing the prepreg in the present Examples will be described.
Polymer Polymer 1 is a polymer obtained in accordance with the following method.

Specifically, 2.9 mol (377 g) of divinylbenzene, 1.7 mol (224.4 g) of ethyl vinyl benzene, 10.4 mol (1,081.6 g) of styrene, and 15 mol (1,532 g) of n-propyl acetate were introduced into a 5.0-liter reactor and stirred. A mixture obtained by the stirring was heated to 70° C., and thereafter, 600 mmol of boron trifluoride diethyl ether complex was added thereto, and the mixture was further stirred at 70° C. for 4 hours to cause divinylbenzene, ethyl vinyl benzene and styrene to react with one another. Thereafter, an aqueous saturated sodium bicarbonate solution was added to the reaction solution in the reactor to stop the reaction. An organic layer separated by the addition was washed with pure water three times. The washed organic layer was devolatilized under a reduced pressure at 60° C. to obtain a polymer 1.

The obtained polymer 1 was a polymer having a structural unit expressed by the formula (1) in the molecule [an aromatic polymer having a structural unit derived from a bifunctional aromatic compound in which two carbon-carbon unsaturated double bonds are bonded to an aromatic ring, which is a compound having a structural unit expressed by the formulae (5) to (7), weight-average molecular weight Mw: 26,300, vinyl equivalent (an equivalent of the vinyl group contained in the structural unit expressed by the formula (1) and in which $R_1$ to $R_3$ each represents a hydrogen atom): 510].

Polymer 2 is a polymer obtained in accordance with the following method.

Specifically, 3.6 mol (468 g) of divinylbenzene, 2.2 mol (290.4 g) of ethyl vinyl benzene, 9.2 mol (956.8 g) of styrene, and 15 mol (1,532 g) of n-propyl acetate were introduced into a 5.0-liter reactor and stirred. A mixture obtained by the stirring was heated to 70° C. and thereafter, 600 mmol of boron trifluoride diethyl ether complex was added thereto, and the mixture was further stirred at 70° C. for 4 hours to cause divinylbenzene, ethyl vinyl benzene, and styrene to react with one another. Thereafter, an aqueous saturated sodium bicarbonate solution was added to the reaction solution in the reactor to stop the reaction. An organic layer separated by the addition was washed with pure water three times. The washed organic layer was devolatilized under a reduced pressure at 60° C. to obtain a polymer 2.

The obtained polymer 2 was a polymer having a structural unit expressed by the formula (1) in the molecule [an aromatic polymer having a structural unit derived from a bifunctional aromatic compound in which two carbon-carbon unsaturated double bonds are bonded to an aromatic ring, which is a compound having a structural unit expressed by the formulae (5) to (7), weight average molecular weight Mw: 31,100, vinyl equivalent (an equivalent of the vinyl group contained in the structural unit expressed by the formula (1) and in which $R_1$ to $R_3$ each represents a hydrogen atom): 380].

Polymer 3 is a polymer obtained in accordance with the following method.

Specifically, 3.9 mol (507 g) of divinylbenzene, 2.3 mol (303.6 g) of ethyl vinyl benzene, 8.8 mol (915.2 g) of styrene, and 15 mol (1,532 g) of n-propyl acetate were introduced into a 5.0-liter reactor and stirred. A mixture obtained by the stirring was heated to 70° C., and thereafter, 600 mmol of boron trifluoride diethyl ether complex was added thereto, and the mixture was further stirred at 70° C. for 4 hours to cause divinylbenzene, ethyl vinyl benzene and styrene to react with one another. Thereafter, an aqueous saturated sodium bicarbonate solution was added to the reaction solution in the reactor to stop the reaction. An organic layer separated by the addition was washed with pure water three times. The washed organic layer was devolatilized under reduced pressure at 60° C. to obtain a polymer 3.

The obtained polymer 3 was a polymer having a structural unit expressed by the formula (1) in the molecule [an aromatic polymer having a structural unit derived from a bifunctional aromatic compound in which two carbon-carbon unsaturated double bonds are bonded to an aromatic ring, which is a compound having a structural unit expressed by the formulae (5) to (7), weight average molecular weight Mw: 39,500, vinyl equivalent (an equivalent of the vinyl group contained in the structural unit expressed by the formula (1) and in which $R_1$ to $R_3$ each represents a hydrogen atom): 320].

In the polymer 1 to 3, the equivalent (the vinyl equivalent) of the vinyl group contained in the structural unit expressed by the formula (1) where $R_1$ to $R_3$ each represents a hydrogen atom was calculated based on an iodine value measurement in accordance with Wijs method. Specifically, a compound which is an object to be measured was first dissolved in chloroform so as to have a concentration of 0.3 g/35 mL to 0.3 g/25 mL. An excessive amount of iodine chloride was added to the double bond present in the solution. The addition encouraged the reaction between the double bond and iodine chloride. After the reaction sufficiently proceeds, 20 mass % aqueous potassium iodide solution was added to the solution reflecting the reaction. In this manner, iodine fraction remaining in the solution reflecting the reaction was extracted into the aqueous phase in the form of $I_3^-$. The aqueous phase with extracted $I_3^-$ was titrated with aqueous sodium thiosulfate solution (0.1 mol/L sodium thiosulfate standard solution) to calculate the iodine value. The iodine value was calculated using the following equation.

Iodine value=[$(B-A) \times F \times 1.269$]/mass of compound($g$)

In the equation, B denotes the titration amount (cc) of 0.1 mol/L sodium thiosulfate standard solution required for a blank test, A denotes the titration amount (cc) of 0.1 mol/L sodium thiosulfate standard solution required for neutralization, and F denotes the titer of sodium thiosulfate.

Curing Agent

Acenaphthylene: Acenaphthylene produced by JFE Chemical Co. Ltd.

Monofunctional Maleimide: IMILEX-P manufactured by Nippon Shokubai Co., Ltd.

Dibromostyrene: Dibromostyrene produced by Tosoh Finechem Corporation

TAIC: triallyl isocyanurate (TAIC manufactured by Nihon Kasei Co., Ltd., molecular weight: 249, number of terminal double bonds: 3)

Polyphenylene Ether: PPE Component

Modified PPE 1 is modified polyphenylene ether obtained by causing polyphenylene ether and chloromethylstyrene to react with each other.

Specifically, the modified polyphenylene ether is obtained by causing a reaction in the following manner.

First, 200 g of polyphenylene ether (SA90 manufactured by SABIC Innovative Plastics IP BV, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Moreover, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal end in the molecule. Specifically, it was confirmed that the solid obtained was ethenylbenzylated polyphenylene ether. This obtained modified polyphenylene ether compound was a modified polyphenylene ether compound expressed by the formula (18), where Y represents a dimethylmethylene group (a group expressed by the formula (16), where $R_{44}$ and $R_{45}$ represent a methyl group), $Z_A$ represents a phenylene group, $R_{12}$ to $R_{14}$ represent a hydrogen atom, and p denotes 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10 mass % (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

$$\text{Residual OH amount}(\mu mol/g)=[(25 \times Abs)/(\varepsilon \times OPL \times X)] \times 10^6$$

Here, ε represents the extinction coefficient and is 4700 L/mol·cm. OPL represents the cell path length and is 1 cm.

Since the calculated residual OH amount (the number of terminal hydroxyl groups) in the modified polyphenylene ether is almost zero, it has been found that the hydroxyl groups in the polyphenylene ether before being modified have almost been modified. From this fact, it has been found that the number of terminal hydroxyl groups decreased from the number of terminal hydroxyl groups in polyphenylene ether before being modified is the number of terminal hydroxyl groups in polyphenylene ether before being modified. In other words, it has been found that the number of terminal hydroxyl groups in polyphenylene ether before being modified is the number of terminal functional groups in the modified polyphenylene ether. That is, the number of terminal functional groups was two.

The intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 2,300.

Modified PPE 2: Modified polyphenylene ether having a terminal hydroxyl group of the polyphenylene ether modified by a methacryloyl group (a modified polyphenylene ether compound expressed by the formula (19), where Y in the formula (19) represents a dimethylmethylene group (expressed by the formula (16), where $R_{44}$ and $R_{45}$ in the formula (16) represent a methyl group) and $R_{15}$ represents a methyl group, SA9000 manufactured by SABIC Innovative Plastics IP BV, weight average molecular weight Mw: 2000, number of terminal functional groups: 2)

Unmodified PPE: polyphenylene ether (SA90 manufactured by SABIC Innovative Plastics IP BV, intrinsic viscosity (IV): 0.083 dl/g, number of terminal hydroxyl groups: 2, weight average molecular weight Mw: 1700)

Epoxy Resin

Epoxy resin: Dicyclopentadiene Epoxy Resin (EPICLON HP7200 manufactured by DIC Corporation, average number of epoxy groups: 2.3)

Initiator

PBP: 1,3-bis (butylperoxyisopropyl) benzene (Perbutyl P manufactured by NOF CORPORATION)

Catalyst

2E4MZ: 2-ethyl-4-methylimidazole (imidazole catalyst, 2E4MZ manufactured by Shikoku Chemicals Corporation)

Inorganic Filler

Silica: Silica particles subjected to a surface treatment with a silane coupling agent having a vinyl group in the molecule (SC2300-SVJ manufactured by Admatechs Co., Ltd.)

Alumina: Alumina particles (AES-11C manufactured by Sumitomo Chemical Co. Ltd.)

Zinc Molybdate Talc: talc having zinc molybdate being present on at least a part of the surface thereof (zinc molybdate carrying talc, KG-911C manufactured by Huber Corporation)

Fibrous Base Material

Q glass: a quartz glass cloth subjected to a surface treatment with a silane coupling agent having a methacrylic group in the molecule (SQF1078C-04 manufactured by Shin-Etsu Chemical Co., Ltd., #1078 type, relative dielectric constant: 3.5, dielectric loss tangent: 0.0015, air permeability: 25 $cm^3/cm^2/sec$)

QL glass: a QL glass cloth (manufactured by Asahi Kasei Corporation, #1078 type, relative dielectric constant: 4.0, dielectric loss tangent: 0.0028, air permeability: 20 $cm^3/cm^2/sec$)

L2 glass: an L2 glass cloth (manufactured by Asahi Kasei Corporation, #1078 type, relative dielectric constant: 4.4, dielectric loss tangent: 0.0018, air permeability: 20 $cm^3/cm^2/sec$)

L glass: an L glass cloth (versatile low dielectric glass cloth, L1078 manufactured by Asahi Kasei Corporation, #1078 type, relative dielectric constant: 4.5, dielectric loss tangent: 0.0038, air permeability: 20 $cm^3/cm^2/sec$)

Preparation Method

First, each component other than the inorganic filler was added to toluene at a composition ratio (parts by mass) shown in Tables 3 to 5 so as to have a solid content concentration of 60 mass % and mixed therewith. The mixture was stirred at room temperature for 60 minutes. Thereafter, the obtained liquid was added with an inorganic filler, and the inorganic filler was dispersed by a bead mill. As a result, a vanish resin composition (varnish) was obtained.

Next, a fibrous base material (glass cloth) shown in Tables 3 to 5 was impregnated with the obtained varnish, and was then heated and dried at 130° C. for roughly 3 to 8 minutes to manufacture a prepreg. At this time, the content (the resin content) of each of the components constituting the resin by a curing reaction such as the polymer, the modified polyphenylene ether, and the curing agent was adjusted to have a value (mass %) shown in Tables 3 to 5.

Thereafter, obtained four sheets of the prepreg were stacked one over another, heated and pressurized under the conditions of the temperature of 200° C., for 2 hours, and the pressure of 3 MPa to obtain an evaluation substrate (a cured product of the prepreg).

Besides, the number of sheets of the obtained prepreg shown in Tables 3 to 5 were stacked one another, and a copper foil (FV-WS manufactured by Furukawa Electric Co., Ltd.) was arranged on both surfaces of the prepreg to thereby form a body to be pressurized. The body to be pressurized was heated and pressurized under conditions of the temperature of 200° C. and the pressure of 3 MPa for 2 hours to manufacture a copper foil-clad laminate serving as an evaluation substrate (a metal-clad laminate) having a thickness of 200 μm and including a copper foil adhered to both surfaces thereof.

Besides, an evaluation substrate (a cured product of a resin composition) formed of a cured product of a resin composition was prepared in the same manner as the evaluation substrate (the cured product of the prepreg) except for exclusion of the fibrous base material.

The evaluation substrates (the cured product of the prepreg, the metal-clad laminate, and the cured product of the resin composition) prepared in this way were evaluated in accordance with the method described below.

Dielectric Characteristics (Relative Dielectric Constant and Dielectric Loss Tangent)

The relative dielectric constant and the dielectric loss tangent of the evaluation substrate (the cured product of the prepreg, the cured product of the resin composition) at 10 GHz were measured in accordance with Cavity Resonator Perturbation Method. Specifically, the relative dielectric constant and the dielectric loss tangent of the evaluation substrate at 10 GHz were measured using a Network Analyzer (N5230A manufactured by Keysight Technologies Godo Gaisha).

Skew: Delay Time Difference

One metal foil (copper foil) of the evaluation substrate (metal-clad laminate) was processed to form ten wirings having a line width of 100 to 300 μm, a line length of 100 mm, and a line spacing of 20 mm. A three-layer plate was manufactured by secondarily stacking the number of sheets of the prepreg shown in Tables 3 to 5 and the metal foil (copper foil) on the surface of the substrate on which this wiring has been formed on the side on which the wiring has been formed. The line width of the wiring was adjusted so that the characteristic impedance of the circuit after the three-layer plate was manufactured was 50Ω.

A delay time at 20 GHz of the obtained three-layer plate was measured. A difference between a maximum value and a minimum value of the resulting delay time was calculated. The thus calculated difference represents a delay time difference. When the delay time difference is larger, a skew relevant to a differential signal is more likely to occur. Thus, the delay time difference serves as a criterion for evaluating the signal quality in relation to the skew. In other words, a larger delay time difference leads to a more likelihood of a reduction in the signal quality due to a skew, and a smaller delay time difference leads to a less likelihood of the reduction in the signal quality due to the skew. Therefore, for evaluation of a skew, a value of 2 picoseconds or less obtained by the calculation above was evaluated as "excellent", a value of more than 2 picoseconds and less than 5 picoseconds was evaluated as "good", and a value of 5 picoseconds or more was evaluated as "poor".

Glass Transition Temperature (Tg)

A Tg of the prepreg was measured using a viscoelasticity spectrometer "DMS 100" manufactured by Seiko Instruments Inc. Here, a dynamic viscoelasticity analysis (DMA) was conducted with a bending module at a frequency of 10 Hz, and a temperature having a maximum tan δ while rising from room temperature to 280° C. under the condition of a temperature rise rate of 5° C./min was defined as Tg.

Oven Heat Resistance

In accordance with a standard of JIS C 6481, the evaluation substrate (the cured product of the prepreg) was left in a constant temperature bath set at 280° C. for 1 hour, and was then taken out of the constant temperature bath. Subsequently, a cured product of the prepreg having been taken out was visually observed. As a result, the cured product of the prepreg was evaluated as "good" under no observation of an occurrence of abnormality such as swelling in the product, or evaluated as "poor" under an observation of the occurrence of abnormality such as swelling in the product.

Heat Resistance 1

The evaluation substrate (the cured product of the prepreg) was subjected to 1,000 thermal cycles each including: cooling the evaluation substrate from room temperature down to −40° C.; holding the evaluation substrate at that temperature for 10 minutes; heating the evaluation substrate up to 125° C.; holding the evaluation substrate at that temperature for 10 minutes; and cooling the evaluation substrate to room temperature. A cured product of the prepreg having been subjected to 1,000 thermal cycles was visually observed. As a result, the cured product of the prepreg was evaluated as "good" under no observation of abnormality such as swelling in the product, or evaluated as "poor" under an observation of the abnormality such as swelling in the product.

Heat Resistance 2

The evaluation substrate (the cured product of the prepreg) was subjected to 1,000 thermal cycles each including: cooling the evaluation substrate from room temperature down to −40° C.; holding the evaluation substrate at that temperature for 10 minutes; heating the evaluation substrate up to 150° C.; holding the evaluation substrate at that temperature for 10 minutes; and cooling the evaluation substrate to room temperature. A cured product of the prepreg having been subjected to 1,000 thermal cycles was visually observed. As a result, the cured product of the prepreg was evaluated as "good" under no observation of abnormality such as swelling in the product, or evaluated as "poor" under an observation of the abnormality such as swelling in the product.

Transmission Loss

One metal foil (copper foil) of the evaluation substrate (metal-clad laminate) was processed to form ten wirings having a line width of 100 to 300 μm, a line length of 1,000 mm, and a line spacing of 20 mm. A three-layer plate was manufactured by secondarily stacking the number of sheets of the prepreg shown in Tables 3 to 5 and the metal foil (copper foil) on the surface of the substrate on which this wiring has been formed on the side on which the wiring has been formed. The line width of the wiring was adjusted so that the characteristic impedance of the circuit after the three-layer plate was manufactured was 50Ω.

The transmission loss (the passage loss) (dB/m) at 20 GHz of the wiring formed on the obtained three-layer plate was measured using a Network Analyzer (N5230A manufactured by Keysight Technologies Godo Gaisha).

Drill Wear Rate

Figure 4:
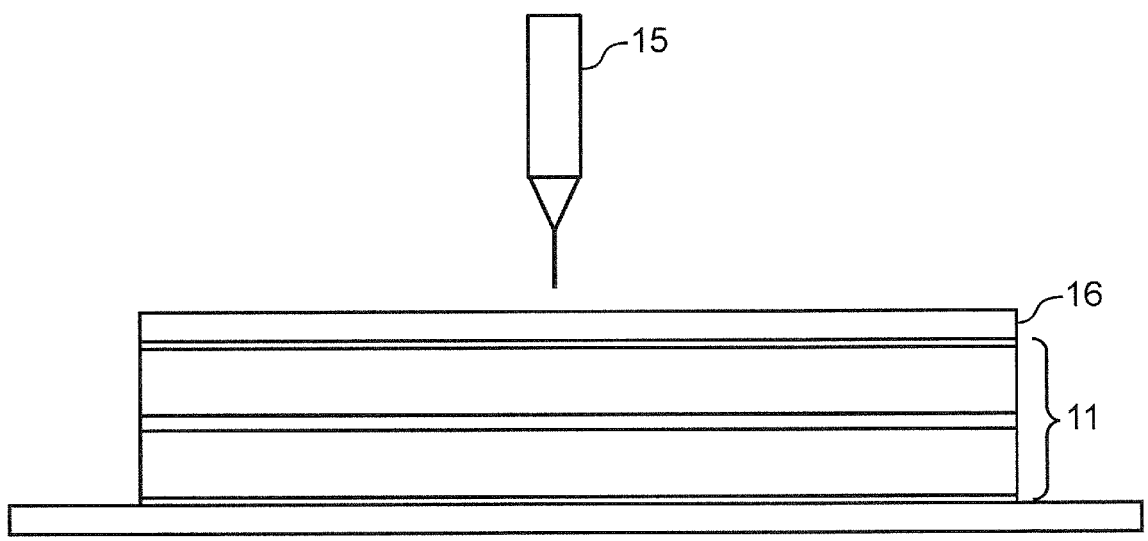
FIG. 4 is a schematic diagram illustrating drill processing in measuring a drill wear rate in Examples.

As shown in FIG. 4, two evaluation substrates (metal-clad laminates) 11 were stacked, and an entry board 16 was placed thereon. On the evaluation substrates (metal-clad laminates) 11 including the entry board 16 arranged thereon, 3,000 holes reaching the evaluation substrates (metal-clad laminates) 11 from the entry board 16 were defined by using a drill 15 under the following processing conditions. The size (area) of a drill blade was measured after the drill processing using the drill blade. A wear rate of the drill blade was calculated based on the size (area) of the drill blade measured after the drill processing and the size (area) of the drill blade measured before the drill processing.

Entry board: Al, 0.15 mm
Number of stacked sheets: 0.75 mm×2 sheets stacked
Hole: Diameter of 0.3 mm×depth of 5.5 mm
Bit serial Number: NHUL 020
Rotational speed: 160 Krpm
Feeding speed: 20μ/rev The results in the evaluations are shown in Tables 3 to 5. The fibrous base material used as the fibrous base material contained in each prepreg was indicated as "yes" in the category of the corresponding fibrous base material in Tables 3 to 5.

TABLE 3

| | | | Examples | | | | | | |
|---|---|---|---|---|---|---|---|---|---|
| | | | 1 | 2 | 3 | 4 | 5 | 6 | 7 |
| Composition (parts by mass) | Polymer | Polymer 1 | 70 | — | — | 50 | 70 | 70 | 70 |
| | | Polymer 2 | — | 70 | — | — | — | — | — |
| | | Polymer 3 | — | — | 70 | — | — | — | — |
| | Curing agent | Acenaphthylene | 30 | 30 | 30 | 50 | 30 | 30 | 30 |
| | Initiator | PBP | 0.5 | 0.5 | 0.5 | 0.5 | 0.5 | 0.5 | 1 |
| | | Azo initiator | — | — | — | — | — | — | — |
| | Catalyst | 2E4MZ | — | — | — | — | — | — | — |
| | Inorganic filler | Silica | 100 | 100 | 100 | 100 | 100 | 100 | 100 |
| | | Alumina | — | — | — | — | — | — | — |
| Content rate of polymer [Polymer/Polymer + Curing agent] (mass %) | | | 70 | 70 | 70 | 50 | 70 | 70 | 70 |
| Relative dielectric constant of cured product of resin composition | | | 2.6 | 2.6 | 2.6 | 2.6 | 2.6 | 2.7 | 2.6 |
| Fibrous base material | Q glass cloth | | yes | yes | yes | yes | yes | yes | yes |
| | QL glass cloth | | — | — | — | — | — | — | — |
| | L2 glass cloth | | — | — | — | — | — | — | — |
| | L glass cloth | | — | — | — | — | — | — | — |
| Resin content (mass %) | | | 61 | 61 | 61 | 61 | 74 | 50 | 61 |
| Number of stacked sheets (sheets) | | | 3 | 3 | 3 | 3 | 2 | 4 | 3 |
| Relative dielectric constant of cured product of prepreg | | | 2.9 | 2.9 | 2.9 | 2.9 | 2.8 | 3.0 | 2.9 |

TABLE 3-continued

| | | | | | | | |
|---|---|---|---|---|---|---|---|
| Dielectric loss tangent of cured product of prepeg | 0.0016 | 0.0016 | 0.0016 | 0.0017 | 0.0017 | 0.0015 | 0.0019 |
| Skew | good | good | good | good | good | good | good |
| Tg (° C.) | 210 | 200 | 230 | 220 | 210 | 210 | 220 |
| Over heat resistance | good | good | good | good | good | good | good |
| Heat resistance 1 | good | good | good | good | good | good | good |
| Heat resistance 2 | good | good | good | good | good | good | good |
| Transmission loss (dB/m) | −20 | −20 | −20 | −20 | −20 | −19 | −21 |

| | | | | Examples | | | | Comparative Example |
|---|---|---|---|---|---|---|---|---|
| | | | 8 | 9 | 10 | 11 | 12 | 1 |
| Composition (parts by mass) | Polymer | Polymer 1 | 70 | 70 | 70 | 70 | 70 | 70 |
| | | Polymer 2 | — | — | — | — | — | — |
| | | Polymer 3 | — | — | — | — | — | — |
| | Curing agent | Acenaphthylene | 30 | 30 | 30 | 30 | 30 | 30 |
| | Initiator | PBP | — | 0.5 | 0.5 | 0.5 | 0.5 | 0.5 |
| | | Azo initiator | 0.5 | — | — | — | — | — |
| | Catalyst | 2E4MZ | — | — | — | — | — | — |
| | Inorganic filler | Silica | 100 | 100 | 100 | 100 | 100 | 100 |
| | | Alumina | — | — | 100 | — | — | — |
| Content rate of polymer [Polymer/Polymer + Curing agent] (mass %) | | | 70 | 70 | 70 | 70 | 70 | 70 |
| Relative dielectric constant of cured product of resin composition | | | 2.6 | 2.9 | 3.6 | 2.6 | 2.6 | 2.6 |
| Fibrous base material | Q glass cloth | | yes | yes | yes | — | — | — |
| | QL glass cloth | | — | — | — | yes | — | — |
| | L2 glass cloth | | — | — | — | — | yes | — |
| | L glass cloth | | — | — | — | — | — | yes |
| Resin content (mass %) | | | 61 | 63 | 64 | 61 | 61 | 62 |
| Number of stacked sheets (sheets) | | | 3 | 3 | 3 | 3 | 3 | 3 |
| Relative dielectric constant of cured product of prepreg | | | 2.9 | 3.1 | 3.7 | 3.0 | 3.1 | 3.2 |
| Dielectric loss tangent of cured product of prepreg | | | 0.0013 | 0.0015 | 0.0016 | 0.0018 | 0.0018 | 0.002 |
| Skew | | | good | excellent | excellent | good | good | poor |
| Tg (° C.) | | | 200 | 210 | 210 | 210 | 210 | 200 |
| Over heat resistance | | | good | good | good | good | good | good |
| Heat resistance 1 | | | good | good | good | good | good | good |
| Heat resistance 2 | | | good | good | good | good | good | good |
| Transmission loss (dB/m) | | | −20 | −19 | −20 | −21 | −21 | −22 |

TABLE 4

| | | | Examples | | | | |
|---|---|---|---|---|---|---|---|
| | | | 13 | 14 | 15 | 16 | 17 |
| Composition (parts by mass) | Polymer | Polymer 1 | 70 | 70 | 70 | 70 | 60 |
| | PPE | Modified PPE 1 | — | — | — | 30 | 10 |
| | | Modified PPE 2 | — | — | — | — | — |
| | | Unmodified PPE | — | — | — | — | — |
| | Curing agent | Acenaphthylene | — | — | — | — | 30 |
| | | monofunctional maleimide | 30 | — | — | — | — |
| | | Dibrosmostyrene | — | 30 | — | — | — |
| | | TAIC | — | — | 30 | — | — |
| | | Epoxy resin | — | — | — | — | — |
| | Initiator | PBP | 0.5 | 0.5 | 0.5 | 0.5 | 0.5 |
| | Catalyst | 2E4MZ | — | — | — | — | — |
| | Inorganic filler | Silica | 100 | 100 | 100 | 100 | 100 |
| | | Alumina | — | — | — | — | — |
| Content rate of polymer [Polymer/Polymer + Curing agent] (mass %) | | | 70 | 70 | 70 | 70 | 60 |
| Relative dielectric constant of cured product of resin composition | | | 2.6 | 2.6 | 2.9 | 2.7 | 2.6 |
| Fibrous base material | Q glass cloth | | yes | yes | yes | yes | yes |
| Resin content (mass %) | | | 61 | 61 | 61 | 61 | 61 |
| Number of stacked sheets (sheets) | | | 3 | 3 | 3 | 3 | 3 |
| Relative dielectric constant of cured product of prepreg | | | 2.9 | 2.9 | 3.1 | 3.0 | 2.9 |

TABLE 4-continued

|  |  |  |  |  |  |
| --- | --- | --- | --- | --- | --- |
| Dielectric loss tangent of cured product of prepeg | 0.0016 | 0.0016 | 0.0017 | 0.0019 | 0.0017 |
| Skew | good | good | good | good | good |
| Tg (° C.) | 215 | 190 | 170 | 170 | 200 |
| Over heat resistance | good | good | good | good | good |
| Heat resistance 1 | good | good | good | good | good |
| Heat resistance 2 | good | poor | poor | poor | good |
| Transmission loss (dB/m) | −20 | −20 | −20 | −21 | −20 |

|  |  |  |  | Examples | Comparative Examples |  |  |  |
| --- | --- | --- | --- | --- | --- | --- | --- | --- |
|  |  |  |  | 18 | 2 | 3 | 4 | 5 |
| Composition (parts by mass) | Polymer | PPE | Polymer 1 | 60 | — | — | — | — |
|  |  |  | Modified PPE 1 | — | — | — | — | — |
|  |  |  | Modified PPE 2 | 10 | 30 | 70 | 70 | — |
|  |  |  | Unmodified PPE | — | — | — | — | 70 |
|  | Curing agent |  | Acenaphthylene | 30 | 70 | 30 | 30 | — |
|  |  |  | monofunctional maleimide | — | — | — | — | — |
|  |  |  | Dibrosmostyrene | — | — | — | — | — |
|  |  |  | TAIC | — | — | — | — | — |
|  |  |  | Epoxy resin | — | — | — | — | 30 |
|  | Initiator |  | PBP | 0.5 | 0.5 | 2 | 0.5 | — |
|  | Catalyst |  | 2E4MZ | — | — | — | — | 0.5 |
|  | Inorganic filler |  | Silica | 100 | 100 | 100 | 100 | 100 |
|  |  |  | Alumina | — | — | — | 200 | — |
| Content rate of polymer [Polymer/ Polymer + Curing agent] (mass %) |  |  |  | 60 | — | — | — | — |
| Relative dielectric constant of cured product of resin composition |  |  |  | 2.6 | 2.5 | 2.6 | 4.3 | 2.8 |
| Fibrous base material | Q glass cloth |  |  | yes | yes | yes | yes | yes |
| Resin content (mass %) |  |  |  | 61 | 62 | 62 | 66 | 61 |
| Number of stacked sheets (sheets) |  |  |  | 3 | 3 | 3 | 3 | 3 |
| Relative dielectric constant of cured product of prepreg |  |  |  | 2.9 | 2.9 | 3.0 | 4.2 | 3.1 |
| Dielectric loss tangent of cured product of prepeg |  |  |  | 0.0017 | 0.0016 | 0.026 | 0.0017 | 0.004 |
| Skew |  |  |  | good | good | good | excellent | good |
| Tg (° C.) |  |  |  | 200 | 190 | 225 | 225 | 190 |
| Over heat resistance |  |  |  | good | poor | good | poor | good |
| Heat resistance 1 |  |  |  | good | good | good | good | good |
| Heat resistance 2 |  |  |  | good | poor | good | good | Poor |
| Transmission loss (dB/m) |  |  |  | −20 | −20 | −24 | −24 | −35 |

It has been found from Tables 3 and 4 that a cured product of the prepreg having a lower relative dielectric constant and a lower dielectric loss tangent is obtainable, and that a wiring board sufficiently suppressing a loss in signal transmission is obtainable as described above in use of a prepreg (Examples 1 to 18) described below compared to no use of the prepreg described below (Comparative Examples 1 to 5). Specifically, the prepreg (Examples 1 to 18) includes: a resin composition or a semi-cured product of the resin composition which contains a polymer and a curing agent at a predetermined ratio, a cured product of the resin composition having a relative dielectric constant of 2.6 to 3.8; and a fibrous base material which is a glass cloth having a relative dielectric constant of 4.7 or less and a dielectric loss tangent of 0.0033 or less. Further, a cured product of the prepreg has a relative dielectric constant of 2.7 to 3.8 and a dielectric loss tangent of 0.002 or less. Moreover, it has been found that, in the case of using the prepreg according to Examples 1 to 18, a wiring board sufficiently suppressing a reduction in signal quality due to a skew as well as sufficiently suppressing a loss in signal transmission is obtainable. Additionally, it has been found that a cured product of the prepreg according to Examples 1 to 18 has a high Tg and high heat resistance.

TABLE 5

|  |  |  |  | Examples |  |  |  |  |  |
| --- | --- | --- | --- | --- | --- | --- | --- | --- | --- |
|  |  |  |  | 1 | 12 | 19 | 20 | 21 | 22 |
| Composition (parts by mass) | Polymer | PPE | Polymer 1 | 70 | 70 | 70 | 70 | 70 | 70 |
|  |  |  | Modified PPE 1 | — | — | — | — | — | — |
|  |  |  | Modified PPE 2 | — | — | — | — | — | — |
|  | Curing agent |  | Acenaphthylene | 30 | 30 | 30 | 30 | — | — |
|  |  |  | monofunctional maleimid | — | — | — | — | 30 | — |
|  |  |  | Dibromostyrene | — | — | — | — | — | 30 |
|  |  |  | TAIC | — | — | — | — | — | — |

TABLE 5-continued

|  |  |  |  |  |  |  |  |  |
|---|---|---|---|---|---|---|---|---|
| Initiator | PBP |  | 0.5 | 0.5 | 0.5 | 0.5 | 0.5 | 0.5 |
| Inorganic filler | Zinc molybdate |  | — | — | 2 | 2 | 2 | 2 |
|  | Talc |  |  |  |  |  |  |  |
|  | Silica |  | 100 | 100 | 100 | 100 | 100 | 100 |
| Content rate of polymer [Polymer/Polymer + Curing agent] (mass %) |  |  | 70 | 70 | 70 | 70 | 70 | 70 |
| Relative dielectric constant of cured product of resin composition |  |  | 2.6 | 2.6 | 2.6 | 2.6 | 2.6 | 2.6 |
| Fibrous base material | Q glass cloth |  | yes | — | yes | — | yes | yes |
|  | QL glass cloth |  | — | — | — | — | — | — |
|  | L2 glass cloth |  | — | yes | — | yes | — | — |
|  | L glass cloth |  | — | — | — | — | — | — |
| Resin content (mass %) |  |  | 61 | 61 | 61 | 61 | 61 | 61 |
| Number of stacked sheets (sheets) |  |  | 3 | 3 | 3 | 3 | 3 | 3 |
| Relative dielectric constant of cured product of prepreg |  |  | 2.9 | 3.1 | 2.9 | 3.1 | 2.9 | 2.9 |
| Dielectric loss tangent of cured product of prepreg |  |  | 0.0016 | 0.0018 | 0.0016 | 0.0018 | 0.0016 | 0.0016 |
| Skew |  |  | good | good | good | good | good | good |
| Over heat resistance |  |  | good | good | good | good | good | good |
| Drill wear rate (%) |  |  | 85 | 32 | 47 | 21 | 36 | 35 |
| Transmission loss (dB/m) |  |  | −20 | −21 | −20 | −21 | −21 | −21 |

|  |  |  | Examples | | | Comparative Example | |
|---|---|---|---|---|---|---|---|
|  |  |  | 23 | 24 | 25 | 1 | 6 |
| Composition (parts by mass) | Polymer | Polymer 1 | 70 | 60 | 60 | 70 | 70 |
|  | PPE | Modified PPE 1 | 30 | — | 10 | — | — |
|  |  | Modified PPE 2 | — | 10 | — | — | — |
|  | Curing agent | Acenaphthylene | — | 30 | 30 | 30 | 30 |
|  |  | monofunctional maleimid | — | — | — | — | — |
|  |  | Dibromostyrene | — | — | — | — | — |
|  |  | TAIC | — | — | — | — | — |
|  | Initiator | PBP | 0.5 | 0.5 | 0.5 | 0.5 | 0.5 |
|  | Inorganic filler | Zinc molybdate | 2 | 2 | 2 | — | 2 |
|  |  | Talc |  |  |  |  |  |
|  |  | Silica | 100 | 100 | 100 | 100 | 100 |
| Content rate of polymer [Polymer/Polymer + Curing agent] (mass %) |  |  | 70 | 60 | 60 | 70 | 70 |
| Relative dielectric constant of cured product of resin composition |  |  | 2.6 | 2.6 | 2.6 | 2.6 | 2.6 |
| Fibrous base material | Q glass cloth |  | yes | yes | yes | — | — |
|  | QL glass cloth |  | — | — | — | — | — |
|  | L2 glass cloth |  | — | — | — | — | — |
|  | L glass cloth |  | — | — | — | yes | yes |
| Resin content (mass %) |  |  | 61 | 61 | 61 | 61 | 61 |
| Number of stacked sheets (sheets) |  |  | 3 | 3 | 3 | 3 | 3 |
| Relative dielectric constant of cured product of prepreg |  |  | 3.1 | 2.9 | 2.9 | 3.2 | 3.2 |
|  |  |  | 61 |  |  |  | 30 |
| Dielectric loss tangent of cured product of prepreg |  |  | 0.0017 | 0.0017 | 0.0017 | 0.002 | 0.002 |
|  |  |  |  |  |  |  | 30 |
| Skew |  |  | good | good | good | poor | poor |
| Over heat resistance |  |  | good | good | good | good | good |
| Drill wear rate (%) |  |  | 29 | 36 | 34 | 26 | 20 |
| Transmission loss (dB/m) |  |  | −21 | −21 | −21 | −22 | −22 |

As it can be seen from Table 5, a metal-clad laminate having a lower drill wear rate was obtained in use of a prepreg (Examples 19 to 25 and Comparative Example 6) including a resin composition containing talc having zinc molybdate being present on at least a part of the surface thereof compared to use of the same containing no talc (Examples 1, 12, and Comparative Example 2). In addition, it has been found that a wiring board having a lower relative dielectric constant and a lower dielectric loss tangent and sufficiently suppressing a loss in signal transmission is obtainable in use of the prepreg described below (Examples 19 to 25) even with a resin composition containing talc having zinc molybdate being present on at least a part of the surface thereof as an inorganic filler, compared to no use of the prepreg described below (Comparative Example 6). Specifically, the prepreg (Examples 19 to 25) includes: a resin composition or a semi-cured product of the resin composition which contains a polymer and a curing agent at a predetermined ratio, a cured product of the resin composition having a relative dielectric constant of 2.6 to 3.8; and a fibrous base material which is a glass cloth having a relative dielectric constant of 4.7 or less and a dielectric loss tangent of 0.0033 or less. Further, a cured product of the prepreg has a relative dielectric constant of 2.7 to 3.8 and a dielectric loss tangent of 0.002 or less. It has been found from these perspectives that the resin composition containing talc having zinc molybdate being present on at least a part of the surface thereof as an inorganic filler results in improving the drill processability while sufficiently suppressing a loss in signal transmission and a reduction in signal quality due to a skew.

This application is based on Japanese Patent Application No. 2019-61262 filed on Mar. 27, 2019, the contents of which are incorporated in the present application.

While the present invention has been fully and appropriately described in the above by way of embodiments in order to express the present invention, it is to be recognized that those skilled in the art can readily change and/or modify the embodiments described above. Therefore, it is to be construed that the changes or modifications made by those skilled in the art are encompassed within the scope of the claims unless those changes or modifications are at a level that departs from the scope of the claims described in the claims section of the present application.

INDUSTRIAL APPLICABILITY

According to the present invention, a prepreg and a metal-clad laminate suitable for manufacturing a wiring board having excellent heat resistance and sufficiently suppressing a loss in signal transmission and a reduction in signal quality due to a skew can be provided. Further, according to the present invention, a wiring board having excellent heat resistance and sufficiently suppressing a loss in signal transmission and a reduction in signal quality due to a skew can be provided.

The invention claimed is:

1. A prepreg, comprising:
    a resin composition or a semi-cured product of the resin composition; and
    a fibrous base material, wherein
    the resin composition contains
        a polymer having
            a repeating unit in which a structural unit expressed by the following formula (6) is repeatedly bonded in a molecule and further
                at least one of a repeating unit in which a structural unit expressed by the following formula (5) is repeatedly bonded in a molecule and
                a repeating unit in which a structural unit expressed by the following formula (7) is repeatedly bonded in a molecule, and
        a curing agent, wherein
    molar content rates of the structural unit expressed by the following formula (5), the structural unit expressed by the following formula (6), and the structural unit expressed by the following formula (7) are 0 to 92 mol %, 8 to 54 mol %, and 0 to 89 mol %, respectively,
    the polymer has a content rate of 40 to 90 mass % relative to a total mass of the polymer and the curing agent,
    a cured product of the resin composition has a relative dielectric constant of 2.6 to 3.8,
    the fibrous base material includes a glass cloth having a relative dielectric constant of 4.7 or less and a dielectric loss tangent of 0.0033 or less, and
    a cured product of the prepreg has a relative dielectric constant of 2.7 to 3.8, and a dielectric loss tangent of 0.002 or less;

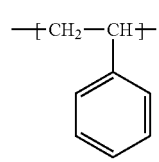
(5)

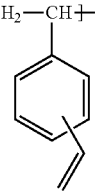
(6)

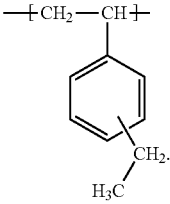
(7)

2. The prepreg according to claim 1, wherein the polymer has a weight average molecular weight of 1,500 to 40,000.

3. The prepreg according to claim 1, wherein, in the polymer, an equivalent of a vinyl group is 250 to 1,200.

4. The prepreg according to claim 1, wherein
    the resin composition further contains a modified polyphenylene ether compound having a terminal end modified by a substituent having a carbon-carbon unsaturated double bond.

5. The prepreg according to claim 4, wherein
    the substituent in the modified polyphenylene ether compound includes at least one selected from a group consisting of a vinylbenzyl group, the vinyl group, an acryloyl group, and a methacryloyl group.

6. The prepreg according to claim 1, wherein
    the fibrous base material includes a base material subjected to a surface treatment with a silane coupling agent having a carbon-carbon unsaturated double bond in a molecule.

7. The prepreg according to claim 6, wherein
    the silane coupling agent includes a silane coupling agent having at least one functional group selected from a group consisting of the vinyl group, a styryl group, a methacrylic group, and an acrylic group in the molecule.

8. The prepreg according to claim 1, wherein
    the curing agent contains at least one selected from a group consisting of styrene, a styrene derivative, divinylbenzene, an acrylate compound, a methacrylate compound, a trialkenyl isocyanurate compound, a polybutadiene compound, a maleimide compound, and an acenaphthylene compound.

9. A metal-clad laminate, comprising:
    an insulating layer containing the cured product of the prepreg according to claim 1; and
    a metal foil.

10. A wiring board, comprising:
    an insulating layer containing the cured product of the prepreg according to claim 1; and
    wiring.

* * * * *